(12) United States Patent
Linn et al.

(10) Patent No.: US 11,909,091 B2
(45) Date of Patent: Feb. 20, 2024

(54) EXPANSION COMPENSATION STRUCTURE FOR AN ANTENNA

(71) Applicant: Kymeta Corporation, Redmond, WA (US)

(72) Inventors: Steven Howard Linn, Hillsboro, OR (US); Mehdi Afkhami Reihani, Redmond, WA (US); Stephen Olfert, Kent, WA (US); Chris Eylander, Redmond, WA (US); Felix Chen, Kirkland, WA (US); Corey Pfeiff, Redmond, WA (US); Jonathan Byron, Redmond, WA (US)

(73) Assignee: KYMETA CORPORATION, Bothell, WA (US)

( * ) Notice: Subject to any disclaimer, the term of this patent is extended or adjusted under 35 U.S.C. 154(b) by 152 days.

(21) Appl. No.: 17/323,800

(22) Filed: May 18, 2021

(65) Prior Publication Data

US 2021/0273311 A1  Sep. 2, 2021

Related U.S. Application Data

(60) Provisional application No. 63/027,186, filed on May 19, 2020.

(51) Int. Cl.
*H01Q 1/38* (2006.01)
*H01Q 1/08* (2006.01)
(Continued)

(52) U.S. Cl.
CPC .............. *H01Q 1/085* (2013.01); *H01Q 1/42* (2013.01); *H01Q 21/005* (2013.01)

(58) Field of Classification Search
CPC ............ H01Q 1/00; H01Q 1/002; H01Q 1/08; H01Q 1/085; H01Q 1/42; H01Q 21/00; H01Q 21/005; H01Q 21/06; H01Q 21/061
See application file for complete search history.

(56) References Cited

U.S. PATENT DOCUMENTS

| 4,908,493 A | 3/1990 | Susemihl |
| 5,057,664 A | 10/1991 | Johnson et al. |

(Continued)

FOREIGN PATENT DOCUMENTS

| CN | 101459057 A | 6/2009 |
| CN | 101471238 A | 7/2009 |

(Continued)

OTHER PUBLICATIONS

International Preliminary Report and Written Opinion on the Patentability of Application No. PCT/US2021/033267 dated Dec. 1, 2022, 8 pages.

(Continued)

*Primary Examiner* — Tho G Phan
(74) *Attorney, Agent, or Firm* — Womble Bond Dickinson (US) LLP

(57) ABSTRACT

Expansion compensation structures for an antenna are disclosed. In one embodiment, the antenna comprises: an array of antenna elements; and a structure coupled to the array of antenna elements, the structure having a plurality of components comprising materials having different coefficients of thermal expansion (CTEs), wherein first and second components of the plurality of components are pin bonded with one or more pins, and one or more components of the plurality of components other than the first and second components are between the first and second components and have one or more slots through which the one or more pins traverse and have CTEs different than CTEs of the first and second components.

13 Claims, 17 Drawing Sheets

(51) Int. Cl.
*H01Q 1/42* (2006.01)
*H01Q 21/00* (2006.01)
*H01Q 21/06* (2006.01)

(56) References Cited

U.S. PATENT DOCUMENTS

| | | | |
|---|---|---|---|
| 5,643,801 A | | 7/1997 | Ishihara et al. |
| 5,888,839 A | | 3/1999 | Ino et al. |
| 5,896,112 A | * | 4/1999 | Bickford ............. H01Q 1/002 343/872 |
| 6,114,997 A | * | 9/2000 | Lee ................. H01Q 21/0006 343/846 |
| 6,759,628 B1 | | 7/2004 | Ino et al. |
| 7,439,114 B2 | | 10/2008 | Ogata et al. |
| 8,309,474 B1 | | 11/2012 | Wang et al. |
| 8,501,638 B1 | | 8/2013 | Zafiropoulo |
| 9,979,097 B2 | * | 5/2018 | Nipper ............... H01Q 13/085 |
| 10,547,097 B2 | * | 1/2020 | Harp ..................... H01Q 1/38 |
| 10,811,784 B2 | * | 10/2020 | Sikes ..................... H01Q 1/48 |
| 11,271,321 B1 | * | 3/2022 | West ...................... H01Q 5/55 |
| 2002/0068391 A1 | | 6/2002 | Jung |
| 2004/0084427 A1 | | 5/2004 | Talwar et al. |
| 2005/0073573 A1 | | 4/2005 | Kerr et al. |
| 2005/0231657 A1 | | 10/2005 | Zhang et al. |
| 2007/0037332 A1 | | 2/2007 | Tanaka |
| 2007/0059949 A1 | | 3/2007 | Yamazaki et al. |
| 2007/0070283 A1 | | 3/2007 | Maki et al. |
| 2007/0103660 A1 | | 5/2007 | Tanaka |
| 2007/0141859 A1 | | 6/2007 | Ishihara et al. |
| 2008/0014685 A1 | | 1/2008 | Govorkov et al. |
| 2008/0073573 A1 | | 3/2008 | Takami et al. |
| 2009/0121157 A1 | | 5/2009 | Moffatt et al. |
| 2009/0219548 A1 | | 9/2009 | Kawakami et al. |
| 2010/0207040 A1 | | 8/2010 | Tanaka et al. |
| 2010/0221898 A1 | | 9/2010 | Nishida et al. |
| 2011/0034009 A1 | | 2/2011 | Hayakawa |
| 2011/0312165 A1 | | 12/2011 | Shimomura et al. |
| 2012/0171876 A1 | | 7/2012 | Venturini et al. |
| 2012/0329178 A1 | | 12/2012 | Moffatt et al. |
| 2014/0138362 A1 | | 5/2014 | Moffatt et al. |
| 2015/0037984 A1 | | 2/2015 | Zhang et al. |
| 2015/0380814 A1 | | 12/2015 | Boutayeb et al. |
| 2016/0035603 A1 | | 2/2016 | Ikenoue et al. |
| 2018/0123260 A1 | | 5/2018 | Sikes et al. |
| 2018/0323490 A1 | | 11/2018 | Harp et al. |
| 2019/0089065 A1 | | 3/2019 | Sikes et al. |
| 2019/0103681 A1 | | 4/2019 | Slota et al. |
| 2021/0203079 A1 | * | 7/2021 | Sazegar ............. H01Q 15/0086 |

FOREIGN PATENT DOCUMENTS

| | | |
|---|---|---|
| CN | 102413986 A | 4/2012 |
| CN | 103578943 A | 2/2014 |
| CN | 103597587 A | 2/2014 |
| JP | 5109661 B2 | 12/2012 |
| KR | 10-0379859 B1 | 7/2003 |

OTHER PUBLICATIONS

International Search Report and Written Opinion on the Patentability of Application No. PCT/US2021/033268 dated Sep. 8, 2021, 13 pages.
International Preliminary Report on Patentability received for PCT Patent Application No. PCT/US15/35851, dated Feb. 2, 2017, 7 pages.
International Preliminary Report on Patentability received for PCT Patent Application No. PCT/US21/33268, dated Dec. 1, 2022, 9 pages.
International Search Report and Written Opinion received for PCT Patent Application No. PCT/US15/35851, dated Aug. 31, 2015, 11 pages.
International Search Report and Written Opinion received for PCT Patent Application No. PCT/US21/33268, dated Sep. 8, 2021, 11 pages.
Notice of Allowance received for Chinese Patent Application No. 201580035113.8, dated Sep. 29, 2019, 3 pages (2 pages of English Translation and 1 pages of Original Document).
Notice of Final Rejection received for Korean Patent Application No. 10-2017-7004667, dated Jan. 22, 2022, 2 pages (1 page of English Translation and 1 page of Original Document).
Office Action received for Chinese Patent Application No. 201580035113.8, dated Nov. 19, 2018, 17 pages (9 pages of English Translation and 8 pages of Original Document).
Office Action received for Chinese Patent Application No. 201710606365.2, dated Mar. 17, 2020, 21 pages (11 pages of English Translation and 10 pages of Original Document).
Request for the Submission of an Opinion received for Korean Patent Application No. 10-2017-7004667, dated April Nov. 19, 2021, 11 pages (6 pages of English Translation and 5 pages of Original Document).
Request for the Submission of an Opinion received for Korean Patent Application No. 10-2017-7004667, dated Nov. 15, 2021, 11 pages (6 pages of English Translation and 5 pages of Original Document).
Request for the Submission of an Opinion received for KR Patent Application No. 10-2017-7004667, dated Oct. 19, 2021, 11 pages (5 pages of English Translation and 5 pages of Original Document).
Taiwan Office Action dated Aug. 6, 2018 for Application No. 104120336 (APPM/22039TW), 7 pages.
The Second Office Action received for Chinese Patent Application No. 201580035113.8, dated Jun. 12, 2019, 14 pages (8 pages of English Translation and 6 pages of Original Document).

* cited by examiner

Iris L2

Iris L1

Patch and Iris L1

Top View

EXPANSION COMPENSATION STRUCTURE FOR AN ANTENNA

PRIORITY

This application claims benefit of priority from U.S. Provisional Application No. 63/027,186, titled "Compensation Structure for an Antenna" and filed May 19, 2020, which is hereby incorporated by reference.

FIELD OF THE INVENTION

Embodiments disclosed herein relate to the field of wireless communication; more particularly, embodiments disclosed herein relate to expansion compensation for structures in an antenna.

BACKGROUND

Feed and aperture assemblies for holographic metamaterial antennas are multicomponent structures of materials. Each of the materials in the feed and aperture assemblies play different roles and have different material properties. These materials must be placed together to form the assembly and may be bonded together or in held contact with each other to achieve the functions required by the radio-frequency (RF) feed. An RF antenna consisting of an RF aperture, RF feed and support structure may consist of coplanar sheets of materials that are bonded or held together.

One of the material properties that may be different between components of an RF aperture, RF feed and support structure is the coefficient of thermal expansion (CTE) of the various materials. Some of the materials used in a feed structure may differ over a range of two orders of magnitude in CTE.

If large planes of feed materials are placed in contact and constrained in the movement over temperature changes, large stresses may result in some feed and aperture components due the differences in thermal expansion of the materials. Feed components may bend or delaminate resulting in antenna performance degradation. If the resulting stresses are large enough, aperture components made of brittle materials may break as a result.

SUMMARY

Expansion compensation structures for an antenna are disclosed. In one embodiment, an antenna comprises: an array of antenna elements; and a structure coupled to the array of antenna elements, the structure having a plurality of components comprising materials having different coefficients of thermal expansion (CTEs), wherein first and second components of the plurality of components are pin bonded with one or more pins, and one or more components of the plurality of components other than the first and second components are between the first and second components and have one or more slots through which the one or more pins traverse and have CTEs different than CTEs of the first and second components.

In another embodiment, an antenna comprises: an antenna aperture having array of antenna elements; and a multi-component radio-frequency (RF) feed bonded to a bottom of the antenna aperture to propagate a feed wave to the antenna aperture, the RF feed comprising a plurality of components having different coefficients of thermal expansion (CTEs) and the CTE of the bottom of the antenna aperture is different than the CTE of a component of the RF feed to which the bottom of the antenna aperture is bonded, wherein bonding between the RF feed and the antenna aperture and between the plurality of components of the RF feed are only in a central area around an origin of the feed wave.

In another embodiment, an antenna comprises: an array of antenna elements; and a segmented, multi-component feed structure coupled to the array of antenna elements, the segmented multi-component structure having a plurality of layers comprising materials having different coefficients of thermal expansion (CTEs) bonded at central locations in each segment.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1A:
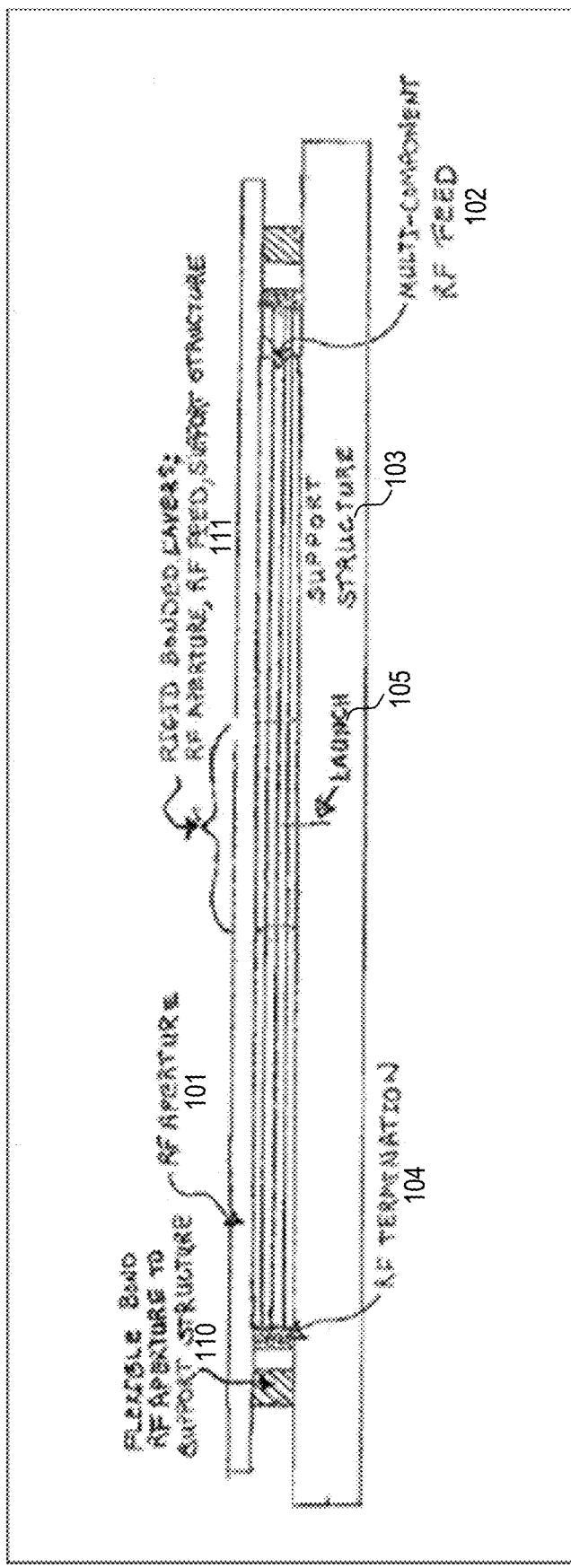
FIG. 1A illustrates a side view of one embodiment of such an antenna assembly.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Techniques are disclosed for compensating for mismatches in CTE (coefficient of thermal expansion) between materials used in radio-frequency (RF) feed and/or aperture assemblies for an antenna. In one embodiment, the antenna comprises a holographic metamaterial antenna and the aperture comprises antenna elements that radiate RF energy. In one embodiment, the antenna elements are surface scattering metamaterial antenna elements. In one embodiment, the surface scattering metamaterial antenna elements comprise liquid crystal (LC)-based antenna elements that use an LC layer for tuning in a manner well-known in the art. In other embodiments, the surface scattering metamaterial antenna elements comprise varactor diode-based antenna elements that use a varactor diode for tuning purposes. Examples of such antennas and antenna elements are described in more detail below. The techniques described herein are not limited to use with the antennas described herein and may be used with other antennas, including those with other types of antenna elements, or structures that have mismatches in CTE between materials.

In one embodiment, radio-frequency (RF) feed and aperture assemblies for an antenna are multicomponent structures of materials having different CTEs and are placed together to form single assembly. By utilizing such materials, the composite Dk (of the dielectric constant) can be manipulated in regions of the feed without incurring high RF losses. These multicomponent structures can comprise coplanar sheets of materials (e.g., low RF loss tangent foams, low loss tangent plastic dielectrics, etc.). In one embodiment, these assemblies are bonded together or held in contact with each other to achieve the functions required by the radio-frequency (RF) feed.

Embodiments described herein include an assembly structure that allows feed and aperture components to be placed in alignment and bonded in locations where the movement of components due to thermal expansion or contraction is small. In one embodiment, the aperture components are also in coplanar contact with each other while the constraint of the feed and aperture components is reduced, and potentially minimized, in portions of the assembly where the thermal movement of the components is high.

In one embodiment, because expansion of feed components due to thermal conditions tends to be outward from a middle point, depending upon the shape of the components, feed layers are bonded at center points. The attachment at these points controls, at least partially, their movements. These means that if there is a low CTE material bonded to an area of a high expansion material whose local movement with temperature is small, the movement of the low temperature material is also small.

In one embodiment, the antenna comprises an assembly of a support structure for an antenna aperture having antenna elements (e.g., RF radiating antenna elements (e.g., metamaterial scattering antenna elements, etc.)), a center-fed RF feed for providing an RF feed wave (e.g., a cylindrical feed wave) and a substrate that includes drive circuitry for driving antenna elements. In one embodiment, the substrate that includes drive circuitry for driving antenna elements comprises a thin-film transistor (TFT) aperture (e.g., a glass aperture). In one embodiment, the TFT aperture comprises a glass aperture that is segmented, where the segments are combined to form one entire aperture. For more information on segmented antenna apertures, see U.S. Pat. No. 9,887,455, titled "Aperture segmentation of a cylindrical feed antenna", issued Feb. 6, 2018. In another embodiment, the TFT glass is a single piece.

In one embodiment, an assembly comprising a support structure, an RF feed and an antenna aperture of antenna elements and contains at least some components that are assembled as adjacent parallel planes of material. In one embodiment, the support structure also operates as the bottom of the waveguide for the feed structure. In one embodiment, the assembly includes parallel planar components that expand thermally from the RF launch at the center of the antenna. Such parallel planar components can be part of a center-fed feed that comprises at least some adjacent parallel planes of material, an RF feed where the top of the waveguide has metallization on the RF aperture, and/or an RF feed having dielectrics where the RF feed is covered beneath an antenna element metal layer (e.g., iris metal layer (e.g., a copper layer, etc.) of slots of iris/patch pairs) of the aperture (on top of the RF waveguide). In one embodiment, the dielectrics do not follow the aperture substrate shape. Examples of antenna apertures with iris/patch pairs are described in more detail below. However, the techniques disclosed herein are not limited to use in such antenna apertures. For example, the techniques disclosed herein may be used in varactor-based antennas, such as those that use varactor diodes for tuning of the antenna elements.

FIG. 1A illustrates a side view of one embodiment of such an antenna assembly. Referring to FIG. 1A, an RF aperture 101 having RF radiating antenna elements is coupled to multi-component RF feed structure 102. Multi-component feed 102 is coupled to support structure 103. In one embodiment, RF aperture 101, multi-component feed 102, and support structure 103 are circular in shape and the feed is a cylindrical feed, such as, for example, described in more detail below. In one embodiment, multi-component feed 102 comprises three, four, five or more component layers. However, in alternative embodiments, multi-component feed 102 can comprise two or more layers. In one embodiment, an RF termination 104 extends round the outside of multi-component feed 102.

In one embodiment, RF aperture 101, multi-component feed 102 and support structure 103 are in a parallel arrangement with respect to each other at their surfaces of contact. In one embodiment, some or all of these surfaces of contact join materials of different CTEs. In one embodiment, a portion of the assembly is bonded together to form rigid bonds in bonded area 111 at the center of the assembly of support structure 103, feed 102 and aperture 101, where the thermal movements, and therefore strains and stress of the assembly components, are small over the operational and storage temperature ranges. Note that bond area 111 encompasses launch 105 of launch assembly 106 that is coupled to multi-component feed 102 through support structure to launch a feed wave (e.g., a cylindrical feed wave) into multi-component feed 102.

Figure 1B:
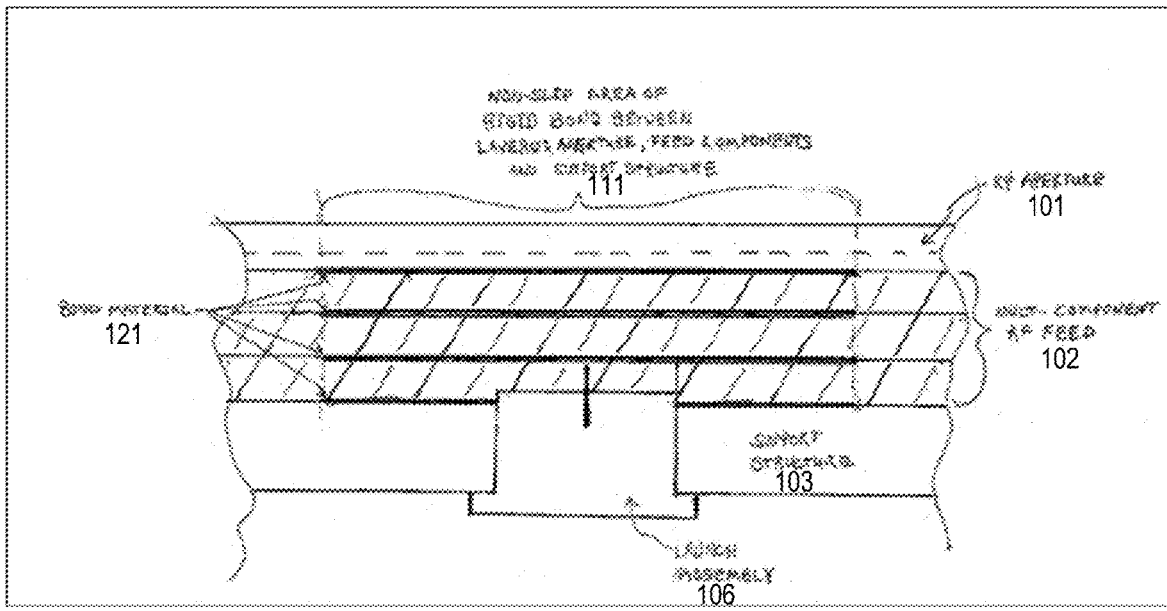
FIG. 1B is an enlarged view of the bonded area shown in FIG. 1A.

FIG. 1B is an enlarged view of the bonded area shown in FIG. 1A. Referring to FIG. 1B, in one embodiment, the bonds in bonded area 111 are a non-slip area of rigid bonds between layers that comprises RF aperture 101, multi-component feed 102, and support structure 103. In one embodiment, the bonds in bonded area 111 in the center portion of the antenna assembly do not allow slippage in x, y, z and theta between bonded components (is a "non-slip" bond) over storage and operational conditions.

The thermal movements associated with thermal expansion and contraction are considered "small" in that the constraint that results from bonding the assembly components together in this center region does not produce unacceptable stresses and strains when the assembled components are subjected to the expected thermal excursions of storage or operational conditions. Unacceptable stresses and strains would produce unacceptable bending, warping, delamination, deformation, unacceptable air gaps, or breakage, all of which have the potential to degrade antenna performance. "Small" results from the bonding being near the center of the expansion of the components where the unconstrained thermal expansion of the components is small compared with the unconstrained expansion at the outer radial edges of the components.

In one embodiment, bonded area 111 provides a way for the components of the assembly to be fixed in alignment with each other in x and y (x and y defining the plane of the RF propagation from the RF launch) in theta (the components orientation with each other in rotation is fixed) and in z (the components are fixed in space "vertically" such that, for example, unwanted air gaps between the component cannot form during the expected operational and storage temperature excursions.

In one embodiment, bonded area 111 includes bonds made of bond material 121. In one embodiment, bond material 121 can comprise adhesive, such as, for example, a pressure sensitive adhesive (PSA). In one embodiment, bond material 121 is disc-shaped around the center of the feed origin (i.e., the origin of the feed wave from the launch). In one embodiment, the range of bond sizes for bond material 121 in bond area 111 at the center (where the movement would be smallest) is between ¼" to 8 inches in diameter centered at the origin of the feed, depending on the type on bond. In one embodiment, the thickness of bond material 121 is 1 mil or less.

In one embodiment, the locations of the antenna assembly where the mismatches in thermal expansion and contraction between component materials of different CTEs will be the greatest will be at the edges of the RF feed because of bending moments and non-uniform thermal displacements, inducing stress concentrations at those edges. The techniques employed herein with the antenna assembly ensure that these areas will be areas where the materials are mostly unconstrained, or, in other words, not bonded or clamped together. This allows adjacent materials of different CTEs in this area to slip with respect to each other.

In one embodiment, support structure 103, components of RF feed structure 102 and aperture 101 are not bonded outside the radius of the bonded center portion, bond area 111, of the antenna assembly, and outside of this radius, components of aperture 101, RF feed structure 102 and support structure 103 are in parallel and are not constrained in planar thermal movement except by friction. Assembly components in this region can slip by each other with low force. In one embodiment, the application of friction reducing materials or substances is included between planes. In one embodiment, examples of these materials include, but are not limited to, small plastic or Teflon beads, fluorinated grease, etc.

In one embodiment, the antenna has a center-fed feed structure that:
  covers the RF radiating antenna element region and feeds a feed wave of RF energy to the RF antenna element region of the RF aperture;
  has an RF absorber (RF termination) at the end of the RF feed structure; and
  has an aperture that overhangs the RF feed and RF termination.

In one embodiment, the support structure extends past the center-fed RF feed structure and RF termination and overlaps the antenna aperture.

In one embodiment, the RF termination structure remains attached to, or is held compressed against, the RF feed termination throughout the storage and operational environmental conditions. In one embodiment, the RF termination is attached or adheres to the RF feed.

In one embodiment, the portion of stack of components in RF feed structure 102 expands much more with temperature that the material used in support structure 103 (e.g., a plate, etc.) or in RF aperture 101. In one embodiment, components of support structure 103 and RF aperture 101 are much stiffer than the high expansion portions of the stacks of components of RF feed structure 102 and their CTEs are more similar than the stack components of RF feed structure 102.

Techniques described herein take advantage of these properties to bond RF aperture 101 to support structure 103 through one or more bonds (e.g., adhesive bonds), effectively clamping the components of RF feed structure 102 between them. This bonding structure has advantages over an external clamping structure in that the bond between RF aperture 101 to support structure 103 is internal, takes up less space than a spring-loaded clamping ring, both in height and in width, and has fewer parts, and is easier to install.

In one embodiment, in the antenna assembly outside of the RF termination, one or more bonds are used to bond RF aperture 101 and support structure 103. In one embodiment, a bond is positioned outside of the location of the maximum expansion of the structure of the assembled RF feed structure 102 and RF termination 104. In one embodiment, the maximum expansion state doesn't push against the bond. One example of this type of bond is bond 110 in FIG. 1A. In one embodiment, bond 110 is the same as the distance in height between RF aperture 101 and support structure 103 in bonded area 111 of the antenna assembly. In one embodiment, bond 110 is an adhesive bond.

Although in one embodiment, the CTE mismatch between support structure 103 and RF aperture 101 is less than between some feed components of RF feed structure 102, the distance between bonding areas on RF aperture 101 and support structure 103 can vary in length with temperature. In one embodiment, the bond is flexible. In one embodiment, the bond is a spring. In one embodiment, the bond is elastomeric. In one embodiment, the bond is an elastomeric adhesive. In one embodiment, the bond is a silicone room temperature vulcanized (RTV), a polyurethane adhesive, or a similar material. In one embodiment, the RTV is thixotropic and can be dispensed and stay in place during assembly. Such bonds can stretch to take up the changes in distance due to both expansion and contraction without overly constraining RF aperture 101. Thus, being flexible, bond 110 compensates for the CTE mismatch between support structure 103 and RF aperture 101. In one embodiment, bond 110 also acts as a spacer between RF aperture 101 and support structure 103 beyond the edge of RF feed structure 102, with the height of the spacer being set by the adhesive.

In one embodiment, the bond is formed at multiple locations in the overlapping area of RF aperture 101 and support structure 103 such that RF aperture 101 is held at these locations approximately at the same distance in height between RF aperture 101 and support structure 103 in the bonded center of the antenna. In one embodiment, the bond locations and heights help to keep RF aperture 101 flat and parallel against RF feed structure 102. Multiple bond locations also help to prevent RF aperture 101 from bowing or cantilevering at the edge of RF feed structure 102. In one embodiment, the bonds are adhesive posts that are located at different distances radially beyond the end of RF feed structure 102 and can act to prevent cantilevering of the substrate (e.g., glass substrate) of one embodiment of RF aperture 101 over the edge of RF feed structure 102.

Figure 1C:
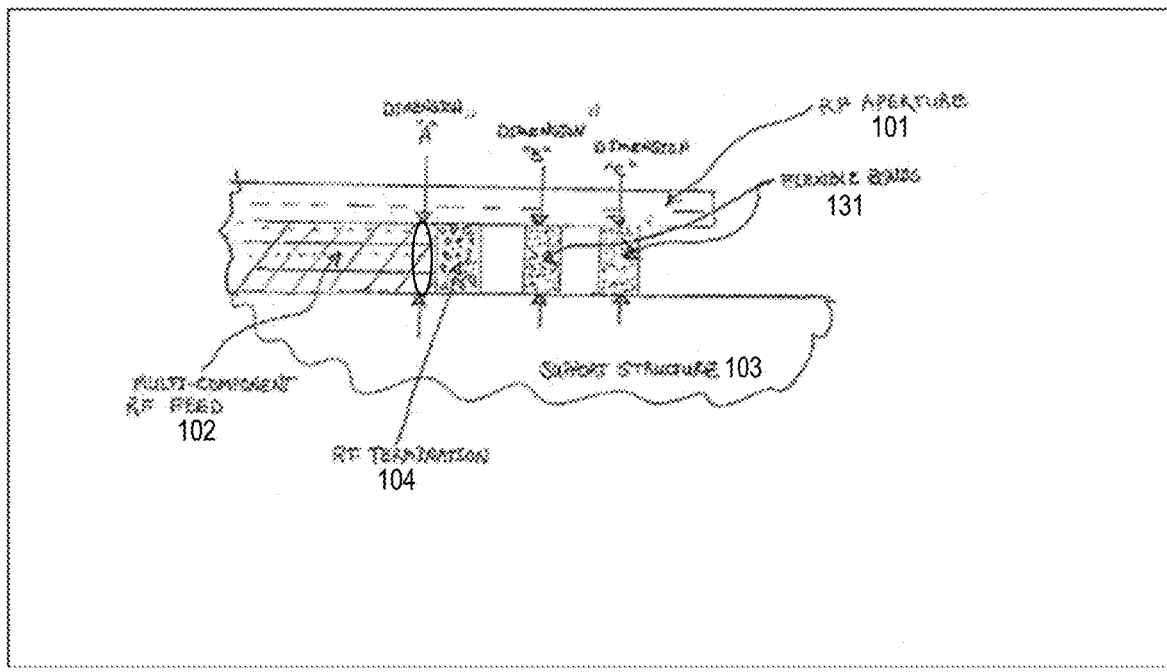
FIG. 1C is a side view of a portion of one embodiment of an antenna

FIG. 1C is a side view of a portion of one embodiment of an antenna. Referring to FIG. 1C, the antenna includes an area beyond the end of RF feed structure 102 containing a plurality of flexible bonds 131. In one embodiment, flexible bonds 131 have heights "B" and "C" that are approximately equal to height "A", which is the height of RF feed structure 102. In one embodiment, a bond can also act as an RF termination.

Figure 1D:
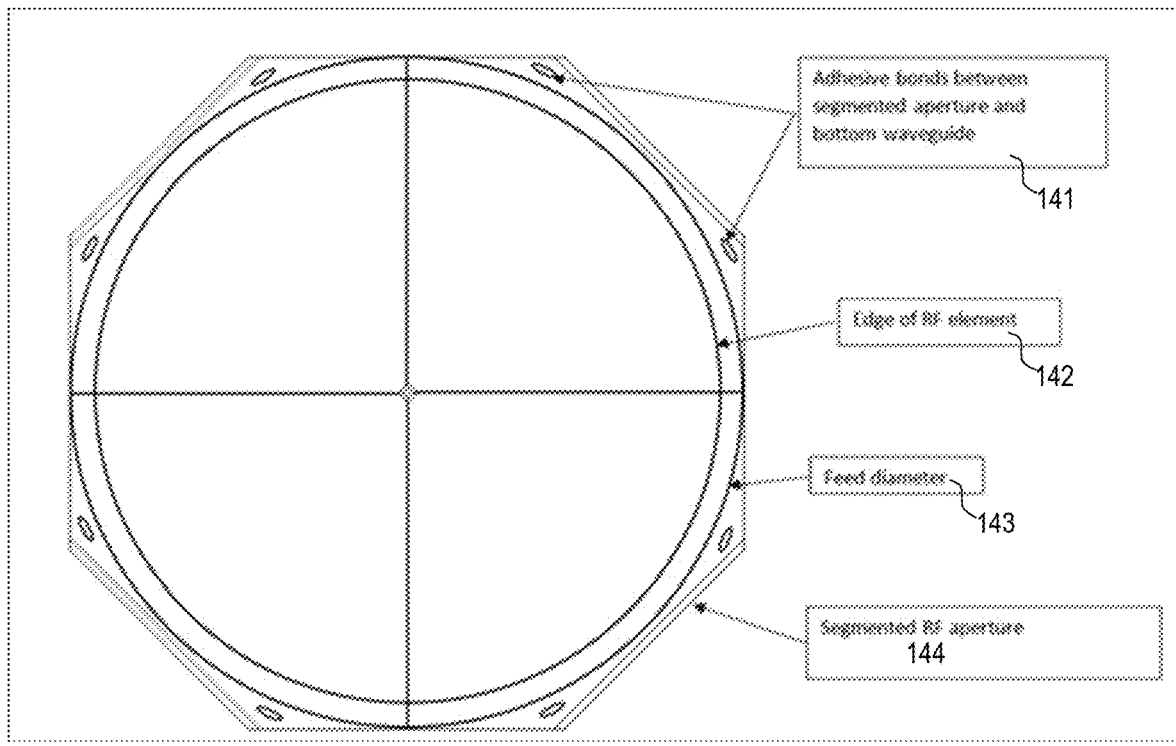
FIG. 1D shows a top view of an antenna that has bonds in multiple locations outside of sides of the RF feed.

FIG. 1D shows a top view of an antenna that has bonds in multiple locations outside of the RF feed. Referring to FIG. 1D, a segmented RF aperture 144 is shown with a feed diameter 143 of an RF feed and an edge 142 of the array of RF radiating antenna elements. Adhesive or other flexible bonds 141 are located between segmented aperture 144 and the bottom waveguide.

In one embodiment, RF feed structure 102 is covered beneath a metal layer of the aperture. In one embodiment, this metal layer is an iris copper layer (of one or more irises of iris/patch pairs) on top of the RF waveguide. However, the dielectrics of RF feed structure 102 follow the aperture shape (e.g., a TFT aperture shape). One difference between this embodiment and the embodiment above is that in the case above the dielectrics of RF feed structure 102 end just outside of the last ring of RF elements and RF termination 104 begins just outside of this end of the dielectrics of RF feed structure 102. In this case, the dielectric shape of RF feed structure 102 follows an edge of the substrate (e.g., glass substrate) of RF aperture 101, ending before the edge of the copper coating.

Figure 1E:
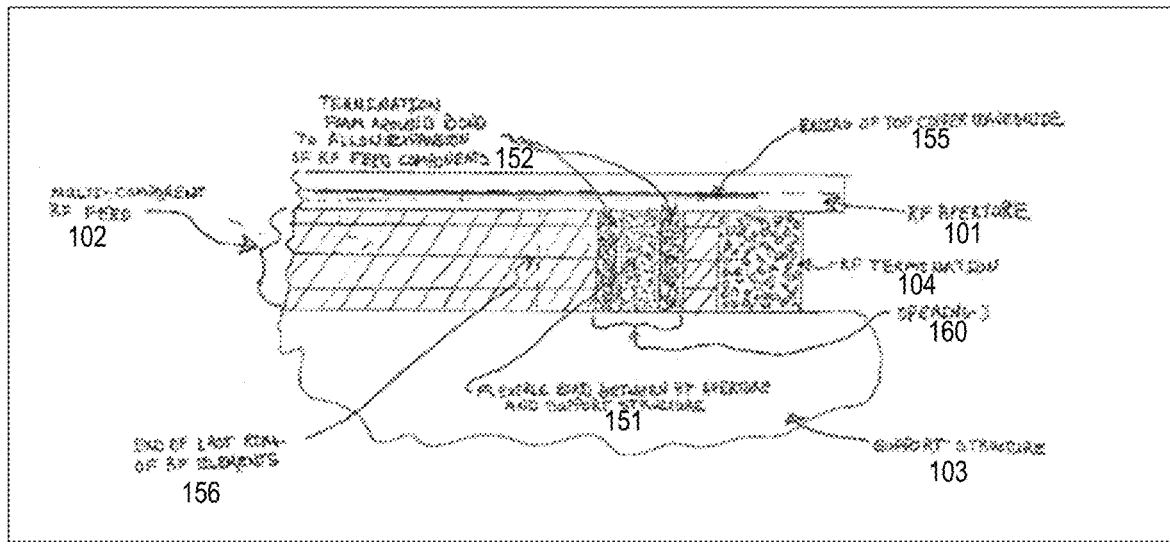
FIG. 1E illustrates a side view of a portion of an antenna assembly.

FIG. 1E illustrates a side view of a portion of an antenna assembly. Referring to FIG. 1E, ending 155 of a metal layer of RF aperture 101 extends beyond the end of a waveguide of RF feed structure 102 to a location over RF termination 104. Opening 160 is at the end of the layers of RF feed structure 102 and includes a flexible bond 151 between RF aperture 101 and support structure 103. On both sides of flexible bond 151 is termination foam 152 that allows thermal expansion of the components of RF feed structure 102. In one embodiment, the thickness of termination foam 152 depends on feed stack height of RF feed structure 102 and should match the feed stack height to prevent RF leak.

Segmentation

In some embodiments, some parallel layers of the RF feed are segmented and bonded together in their center regions to reduce the effects of thermal expansion when their CTE of their materials is different. These embodiments are different than the antenna assemblies described above in which the central areas of the RF aperture, RF feed structure and support structure are bonded together to constrain feed component layers, where if unconstrained, simple feed component layers expand outward from a center point.

More specifically, if there is a low CTE material bonded to a high CTE material only at their centers, even though the two materials have a large CTE mismatch, the unconstrained displacements of the materials are small if they are close to their centers of expansion. Thus, if the materials are bonded together at the center of their expansion and are now constrained by each other and the area of the bond is at the center is small, the resulting stresses will be small as well.

However, there are other considerations than whether the resulting stresses will be small. That is, even though bonding a small area in the center regions of high CTE and low CTE materials will reduce the thermal stresses of these components in the center region, this may not be a sufficient condition to fulfill all feed requirements. If the bonding in the center region is a small area, then the bond may be insufficient to keep flexible components planar over the full feed structure. Also, if the center bond area is too small, the bond area may not be able to keep components joined during vibration, shock, altitude, etc. On the other hand, if the center bond area is increased to too large an area, buckling of a low CTE material bonded to a high CTE may occur when the temperature decreases.

If the component layer replaced by the subcomponents is a layer of material of high CTE, the high CTE subcomponents have expansion/contraction center points of their own, now away from the center point of the feed. These centers can act as more thermally stable positions for bonding high CTE materials to lower CTE materials. By bonding the centers of the high CTE subcomponents to feed layers of low CTE, this can provide a feed layer of high CTE material that has thermal movement more like the low CTE material layer.

In one embodiment, feed components are divided into subcomponents to make a planar feed layer. In one embodiment, feed components are divided into subcomponents where the gaps between subcomponents follow seams between RF aperture segments. In one embodiment, the feed components are divided into subcomponents where the gaps between components follow seams between RF aperture segments and the gaps between components.

In some embodiments, feed layers of single component high CTE materials are replaced with feed layers where the high CTE materials within the layer are divided into subcomponents. By separating single layers into subcomponents, each of the subcomponents of the layer formed from these subcomponents now has a line or center point where expansion or contraction with temperature originates. That is, each of the subcomponents has, for example, a center point where the expansions or contractions along a line through the center point are opposite in direction. Sized and placed properly, space is created between layer subcomponents to accommodate expansion.

Figure 2A:
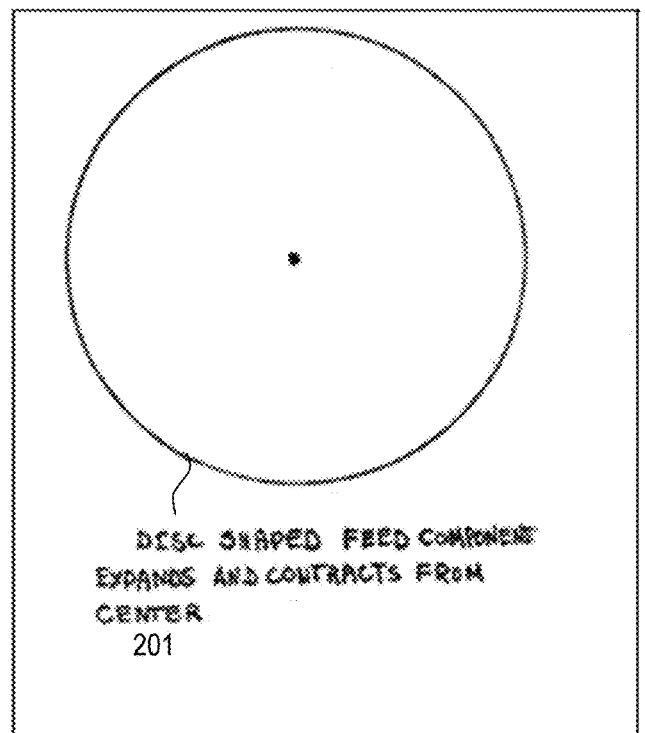
FIG. 2A illustrates one embodiment of a disc-shaped feed component.
Figure 2B:
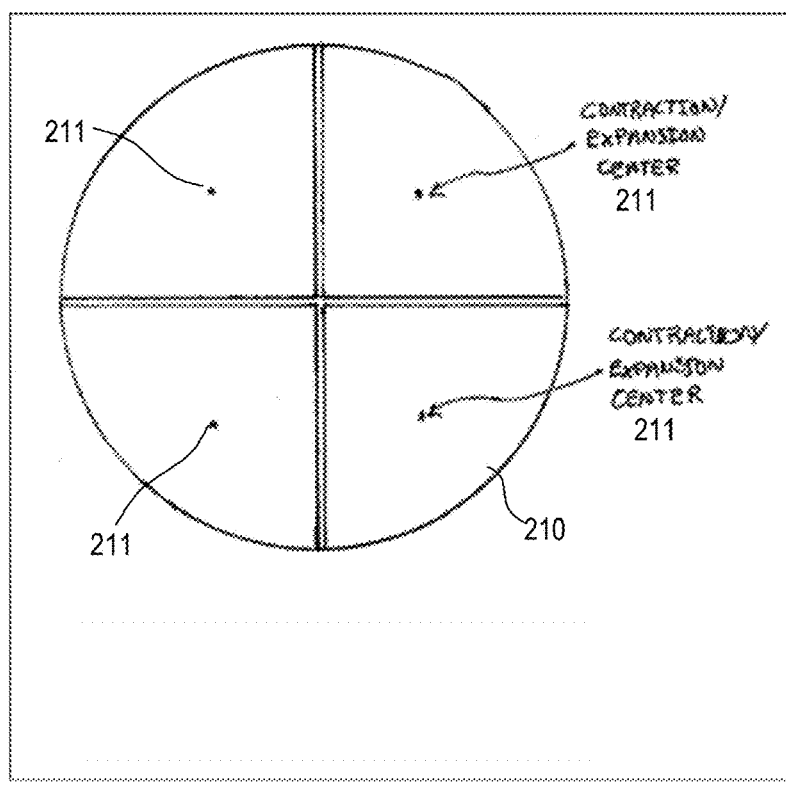
FIG. 2B illustrates another embodiment of a disc-shaped feed structure.

FIG. 2A illustrates one embodiment of a disc-shaped feed component. Referring to FIG. 2A, the disc-shaped feed component expands and contracts from its center. FIG. 2B illustrates another embodiment of a disc-shaped feed structure. Referring to FIG. 2B, the disc-shaped feed component of FIG. 2A has been replaced with four subcomponents 210, where each subcomponent 210 is a quarter of the disc. Subcomponents 210 expand and contract from a center, e.g., center 211, with temperature changes. In one embodiment the segmented feed structure is unified by being bonded to the support structure (e.g., a plate, etc.) below the RF feed, where the support structure is also the bottom of the radial waveguide. In another embodiment, some planar components of the feed structure are segmented, while other planar components of the feed structure are not.

In one embodiment, the feed structure has higher expansion components formed from feed components that have centers of expansion/contraction, with an upper material and feed material below the TFT aperture where the upper material is pushed against the RF aperture by a spring where the spring is formed by a weather facing antenna structure.

In one embodiment, a clamping structure sandwiches the RF aperture between an upper material and feed material below the TFT aperture where the upper material is pushed against the RF aperture by a spring where the spring is formed by a radome.

Pinned Feed Components

In one embodiment, the feed components of mismatched CTE are held together with a minimal preload on the feed components. In one embodiment, small pins are placed through the higher CTE structure components of the structure to pin higher CTE together feed components together, while lower CTE component are slotted to allow movement of the pins through the lower CTE material. This allows bonding of feed materials and structures without an external preload pressure. In one embodiment, the small pins are used to pin bond the components of high CTE material together. In one embodiment, the small pins are dielectric pins with rounded sides.

Figure 3A:
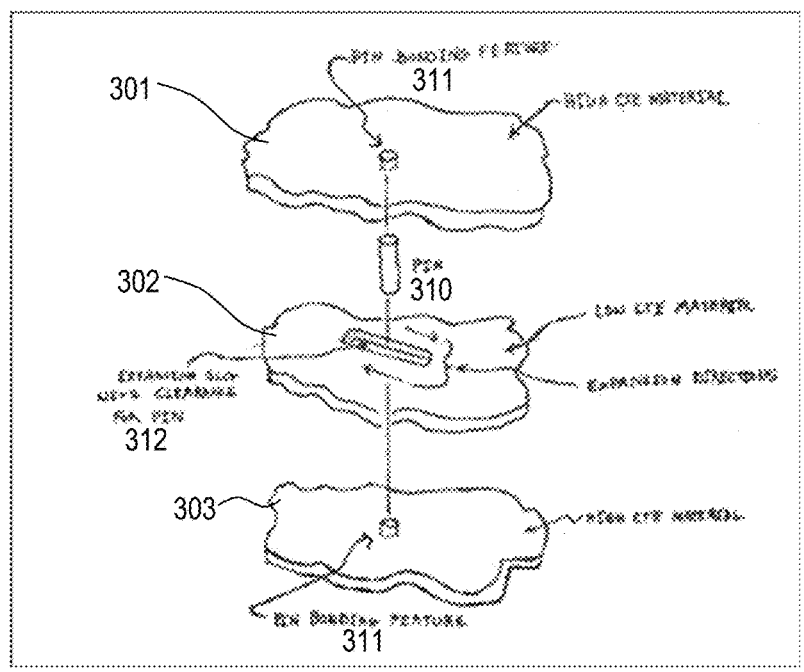
FIGS. 3A and 3B illustrate examples of pinned feed components.
Figure 3B:
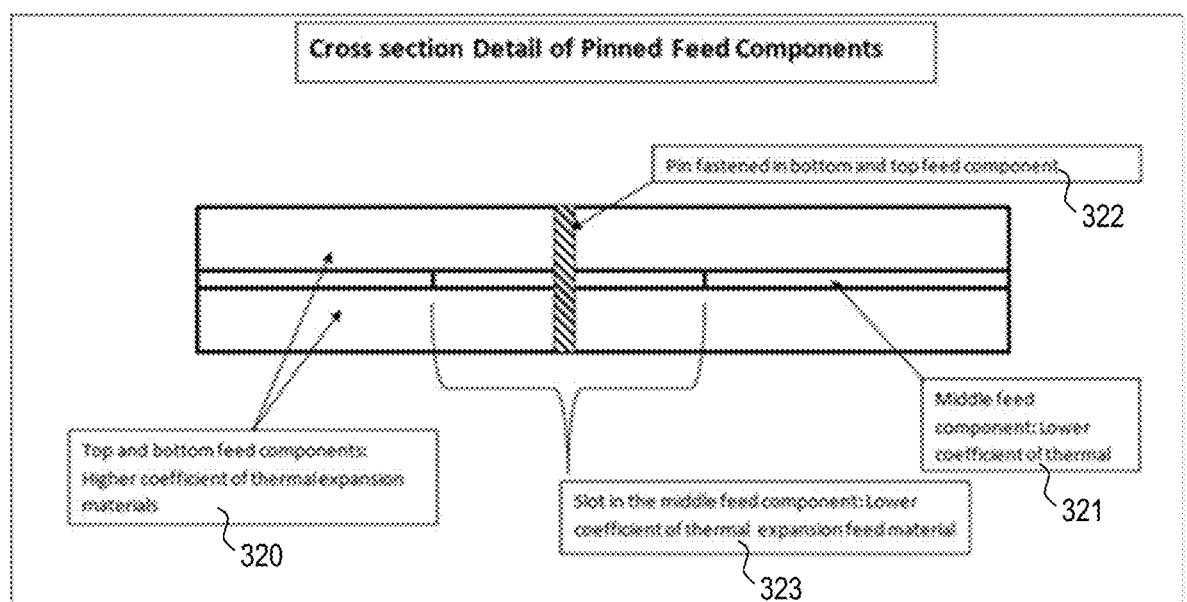

FIGS. 3A and 3B illustrate examples of pinned feed components. Referring to FIG. 3A, components 301 and 303 are pinned together using pin 310, resulting in a pin bonding feature 311. Pin 310 extends through an expansion slot 312 in component 302 which is in the direction that component 302 moves due to thermal expansion. In one embodiment, components 301 and 303 comprise materials with a higher CTE than component 302. In another embodiment, components 301 and 303 comprise materials with a lower CTE than component 302, as there would be an advantage to slotting the high CTE materials and pinning through the lower CTE materials from the substrate (e.g., glass substrate) of RF aperture to the support structure.

Referring to FIG. 3B, the cross section of the pinned feed components show pin 322 fastened in top and bottom feed components 320 with middle feed component 321 between top and bottom feed components 320. In one embodiment, top and bottom feed components 320 have higher CTE materials than middle feed component 321. The cross section also shows a slot 323 in middle feed component 321.

Composite and Corrugated Feed Dielectrics

In one embodiment, structures comprised of bonded composite dielectric materials are used in the RF feed structure. These enable the RF effective index of refraction to be tuned to desired design targets. In one embodiment, the structures include one or all of sintered dielectric materials containing plastics, bonded materials using ceramics, and on-woven plastic materials.

In one embodiment, the dielectric properties of RF feed materials can be adjusted by combining high and lower dielectric constant materials so that the effective dielectric constant is the desired value and the combined materials are homogenous in the RF propagation direction. In one embodiment, there may be holes or gaps in a dielectric, and where the low dielectric material may be air, inert gas, or an absence of material such as a vacuum.

Figure 4:
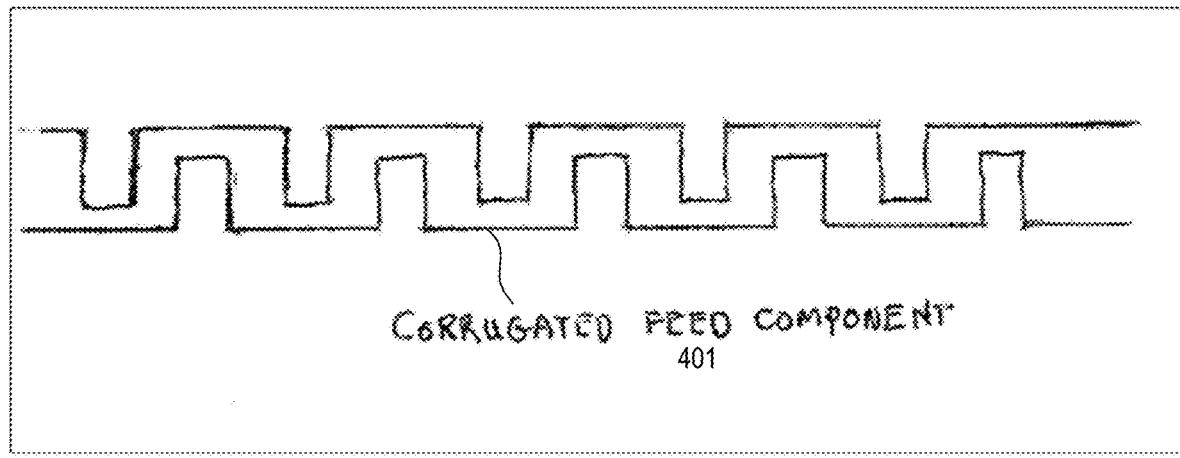
FIG. 4 illustrates one embodiment of a corrugated dielectric for an RF feed.

In one embodiment, structures with corrugated dielectrics are used in the RF feed structure to control the RF effective index of refraction. FIG. 4 illustrates an example of a corrugated feed component. Referring to FIG. 4, corrugated feed component 401 comprises shaped into alternate ridges and grooves. In one embodiment, the ridges and grooves resemble a sawtooth pattern.

Radome Preload

In one embodiment, the radome design dome is preloaded onto an RF aperture and RF feed. In this case, the material assembly is placed above the TFT aperture and feed assembly below the TFT aperture, where the upper material is pushed against the RF TFT aperture by a preload that is formed as part of a weather facing antenna structure.

Figure 5A:
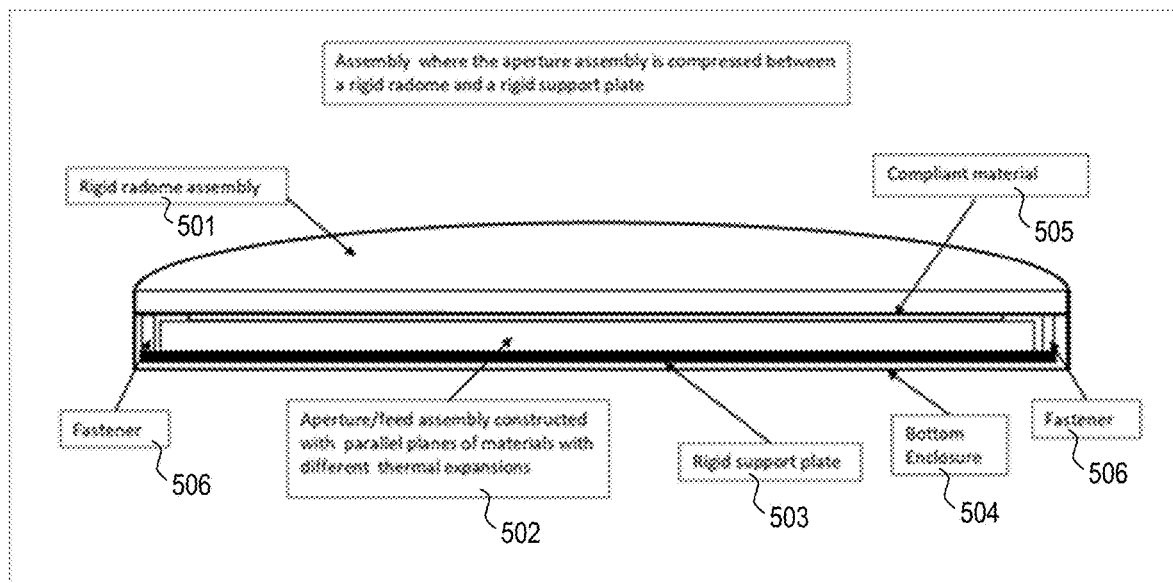
FIG. 5A illustrates a side view of one embodiment of a radome with preload.

FIG. 5A illustrates a side section view of one embodiment of an antenna assembly with preload. Referring to FIG. 5A, RF aperture and RF feed assembly 502 is compressed between a rigid radome assembly 501 with a compliant material 505 in between the two. In one embodiment, RF aperture and RF feed assembly 502 is constructed with parallel planes of materials with different CTE. Fasteners 506 coupled the rigid radome assembly 501 to a rigid support plate (structure) 503 that holds RF aperture and RF feed assembly 502 in the compressed state. Fasteners 506 can comprise spring fasteners. Bottom enclosure 504 encloses the bottom of the antenna assembly. In one embodiment, compliant material 505 is compressed and acts as a spring. In another embodiment, compliant material 505 is a low Dk, loss tangent dielectric material. In yet another embodiment, compliant material 505 is a dielectric foam.

In an alternative embodiment, snap fit assembly with snap connections is used instead of fasteners 506 to hold the antenna assembly in a compressed state. In yet another alternative embodiment, radome assembly 501 is compressed via a clamping ring.

In one embodiment, a clamping structure sandwiches the RF aperture between an upper material and feed material below the TFT aperture, where the upper material is pushed against the RF aperture by a spring where the spring is formed by a radome.

Figure 5B:
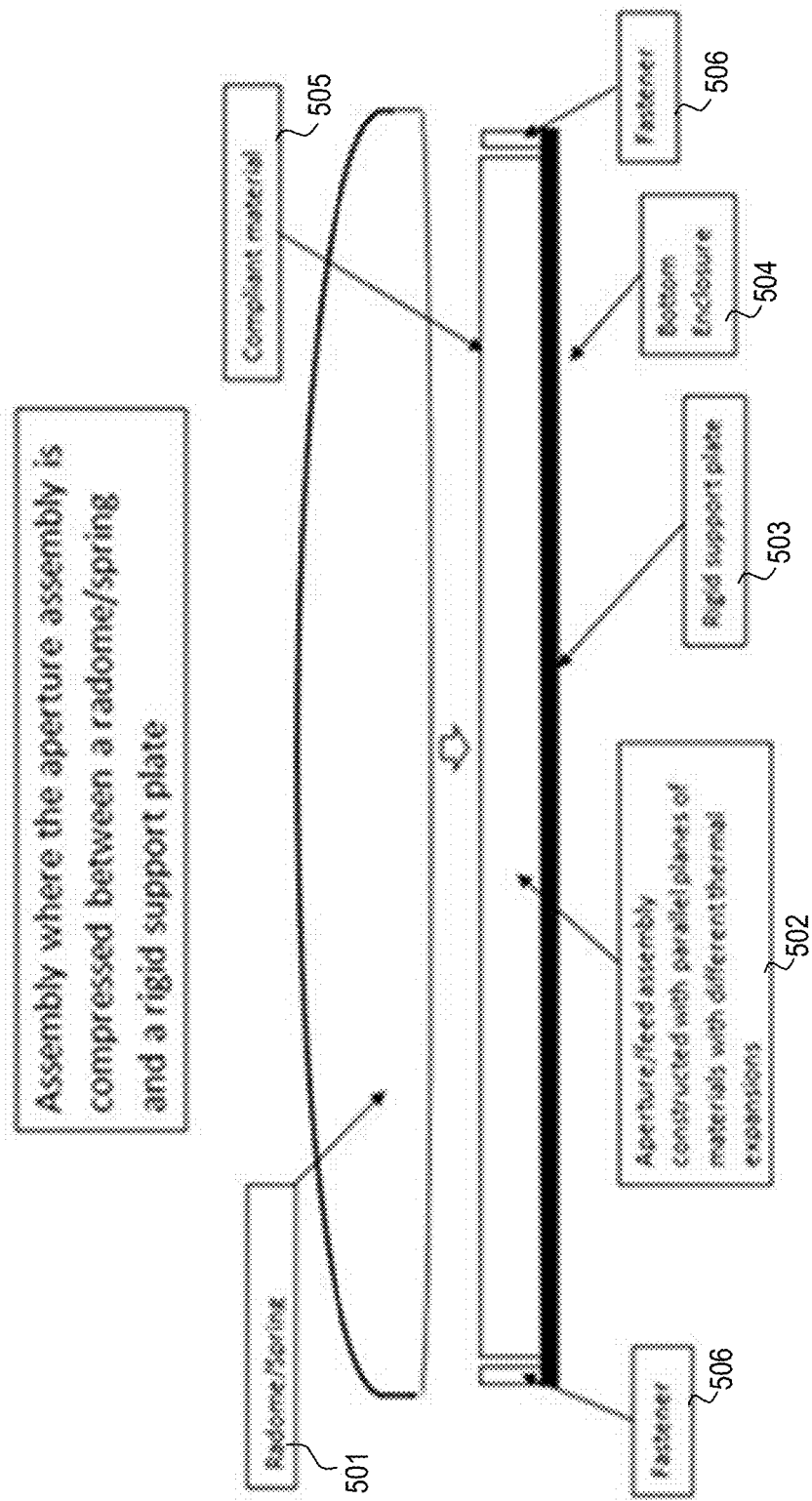
FIGS. 5B and 5C illustrate one embodiment of a radome spring.
Figure 5C:
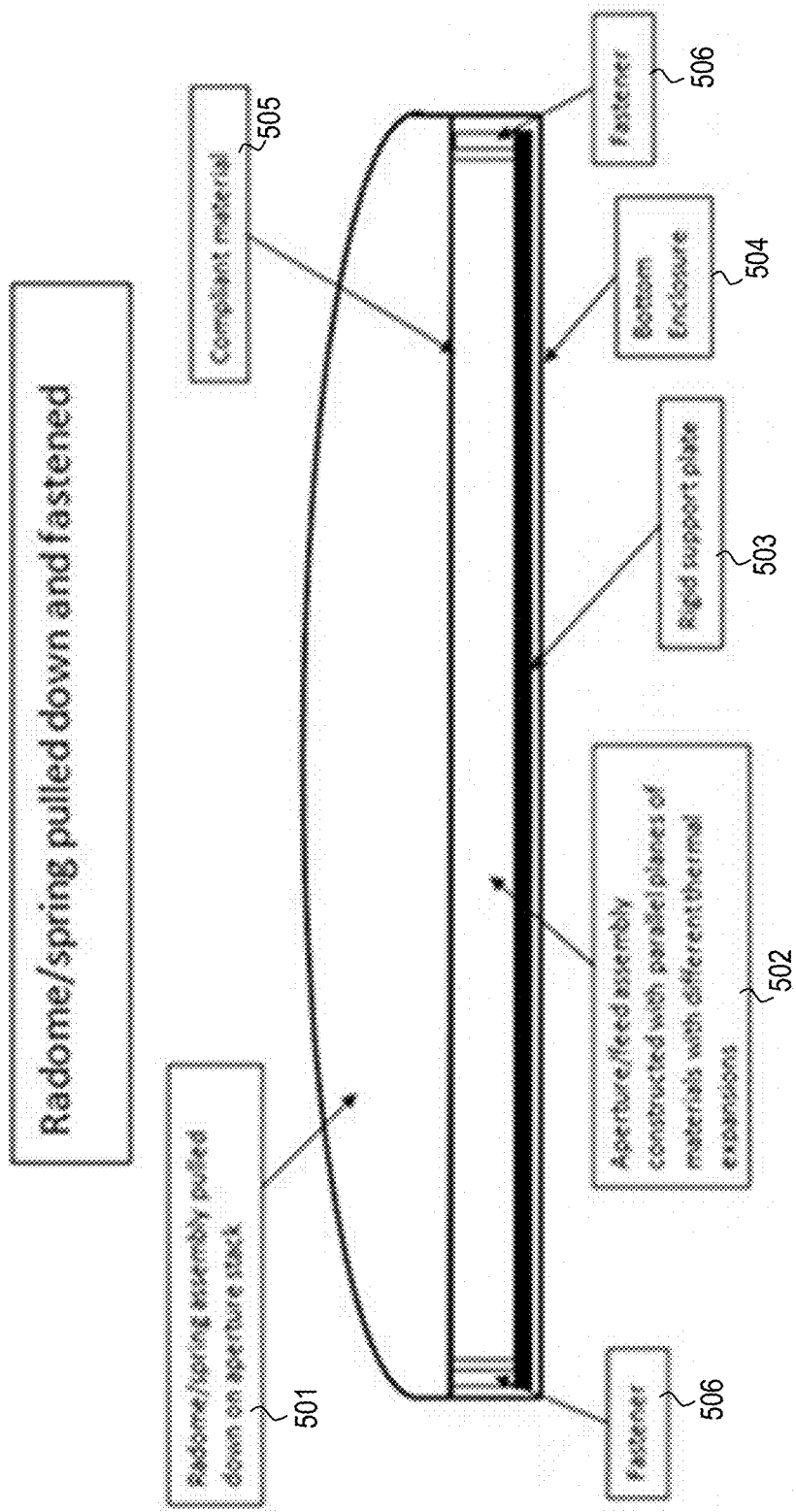

FIGS. 5B and 5C illustrate a side section view of one embodiment of an antenna assembly with a radome spring. Referring to FIGS. 5B and 5C, compliant material 505 is on top of RF aperture and RF feed assembly 502 and radome 501 operates as a spring to clamp down on RF aperture and RF feed assembly 502. FIG. 5B illustrates radome 501 as a spring prior to being pulled down, while FIG. 5C illustrates radome 501 pulled down on the aperture stack.

In an alternative embodiment, an external clamping ring is used to press around the outside edge of the antenna from above the aperture. This ensures that the RF feed components under the ring have a clamping force. In one embodiment, some room is left above the aperture and feed stack and may increase the height of the assembly.

In one embodiment, the bottom of radome 501 may be flat. In another embodiment, the bottom of radome 501 may be curved or have features to provide localized loading.

Figure 5D:
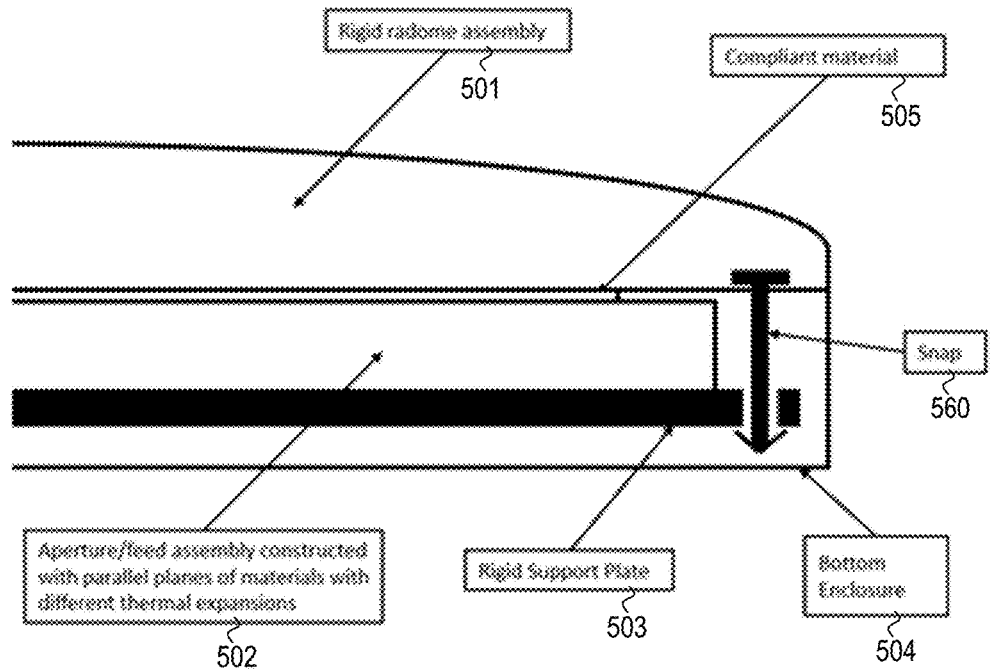
FIGS. 5D and 5E illustrate side section views of embodiments of an antenna assembly with a snap fit assembly instead of fasteners to hold the antenna assembly in a compressed state.
Figure 5E:
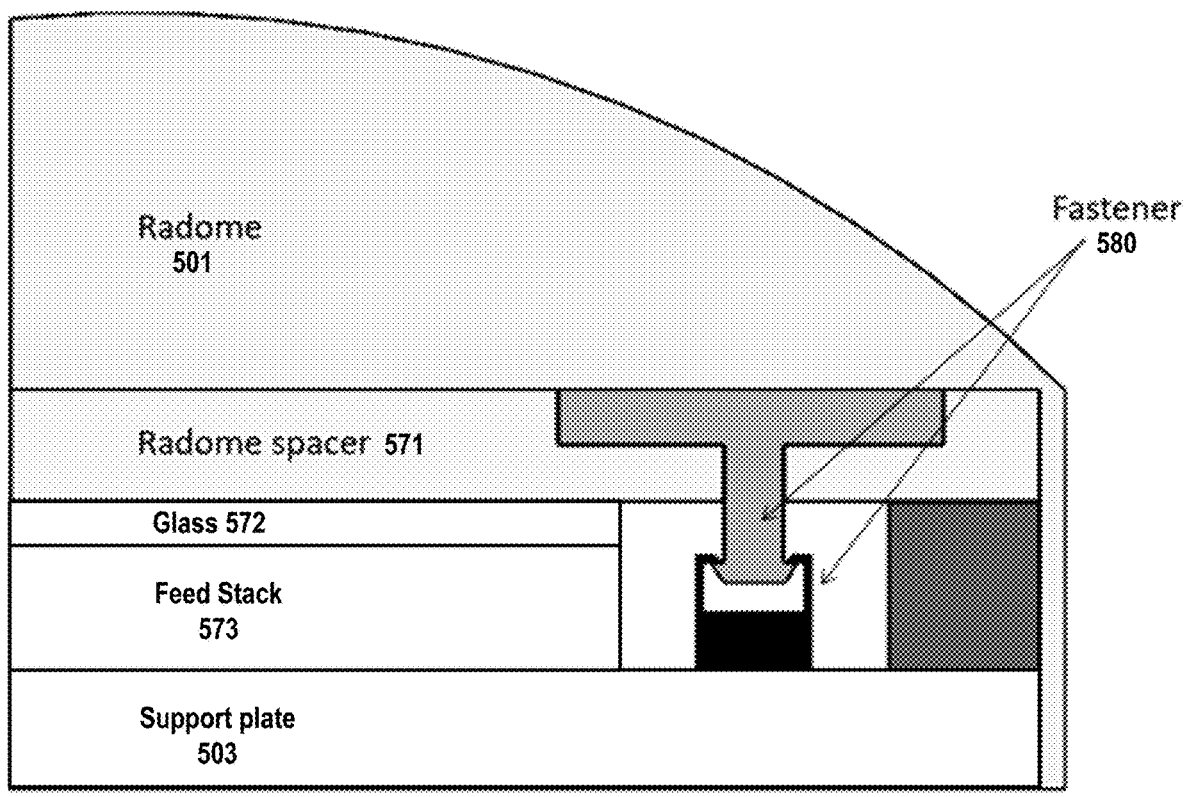

FIGS. 5D and 5E illustrate side section views of embodiments of an antenna assembly with a snap fit assembly instead of fasteners to hold the antenna assembly in a compressed state. Referring to FIG. 5D, snap connections 560 to couple rigid radome assembly 501 to support structure 503 along the sides of the antenna assembly are used to hold rigid radome assembly 501 in a compressed state against compliant material 505 and the rest of the antenna assembly.

Referring to FIG. 5E, rigid radome assembly is held in a compressed state with respect to the rest of the antenna assembly using fasteners such as fastener 580 that are along the edge of the antenna assembly with a snap that is inserted into a hole and its extensions or teeth extend to hook the sides of the hole to prevent the snap's removal. In this case, the hold is coupled to support structure (plate) 503 but extends above it.

The antenna assembly also includes a radome spacer 571, which maintains a space between radome assembly 501 and glass layer 572. In one embodiment, radome spacer 571 is a compliant material. Glass layer 572 comprises one or more glass substrates that are part the antenna aperture with the RF antenna elements. Glass layer 572 is over RF feed stack/structure 573 that sits on top of support structure 503.

Antenna Elements

Figure 6:
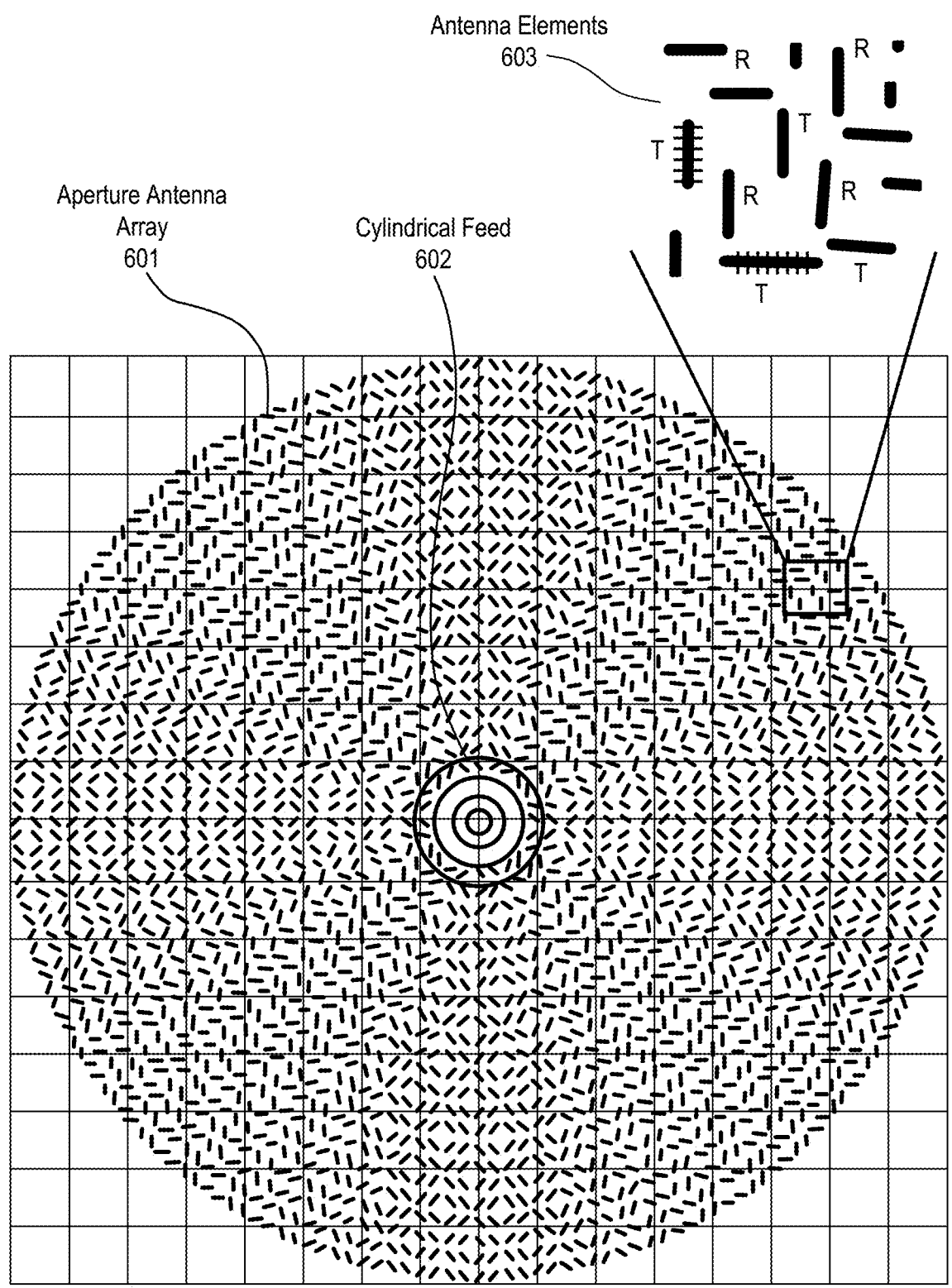
FIG. 6 illustrates an aperture having one or more arrays of antenna elements placed in concentric rings around an input feed of the cylindrically fed antenna.

FIG. 6 illustrates the schematic of one embodiment of a cylindrically fed holographic radial aperture antenna. Referring to FIG. 6, the antenna aperture has one or more arrays 601 of antenna elements 603 that are placed in concentric rings around an input feed 602 of the cylindrically fed antenna. In one embodiment, antenna elements 603 are radio frequency (RF) resonators that radiate RF energy. In one embodiment, antenna elements 603 comprise both Rx and Tx irises that are interleaved and distributed on the whole surface of the antenna aperture. Examples of such antenna elements are described in greater detail below. Note that the RF resonators described herein may be used in antennas that do not include a cylindrical feed.

In one embodiment, the antenna includes a coaxial feed that is used to provide a cylindrical wave feed via input feed 602. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

In one embodiment, antenna elements 603 comprise irises and the aperture antenna of FIG. 6 is used to generate a main beam shaped by using excitation from a cylindrical feed wave for radiating irises through tunable liquid crystal (LC) material. In one embodiment, the antenna can be excited to radiate a horizontally or vertically polarized electric field at desired scan angles.

In one embodiment, the antenna elements comprise a group of patch antennas. This group of patch antennas comprises an array of scattering metamaterial elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one embodiment, a liquid crystal (LC) is disposed in the gap around the scattering element. This LC is driven by the direct drive embodiments described above. In one embodiment, liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty-five-degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one embodiment, as discussed above, a matrix drive is used to apply voltage to the patches in order to drive each cell separately from all the other cells without having a separate connection for each cell (direct drive). Because of the high density of elements, the matrix drive is an efficient way to address each cell individually.

In one embodiment, the control structure for the antenna system has 2 main components: the antenna array controller, which includes drive electronics, for the antenna system, is below the wave scattering structure, while the matrix drive switching array is interspersed throughout the radiating RF array in such a way as to not interfere with the radiation. In one embodiment, the drive electronics for the antenna system comprise commercial off-the shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three-axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Figure 7:
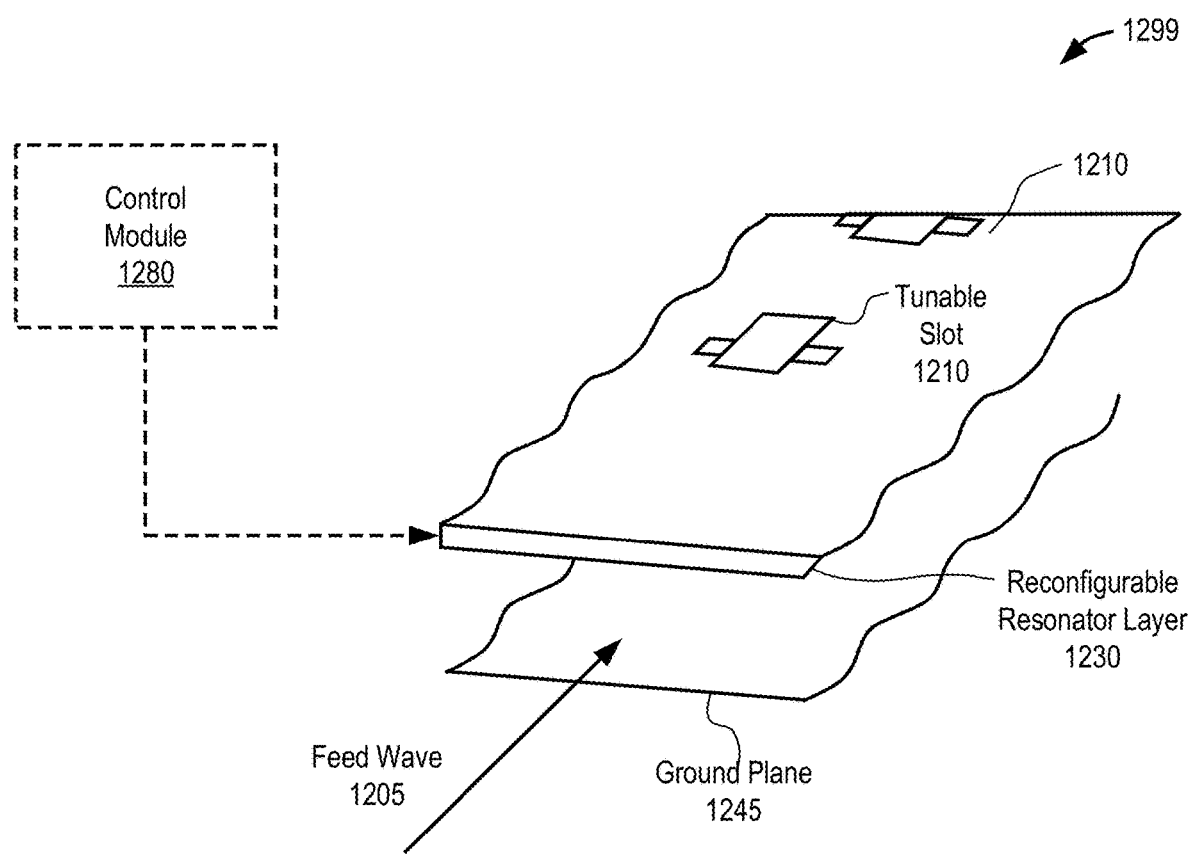
FIG. 7 illustrates a perspective view of one row of antenna elements that includes a ground plane and a reconfigurable resonator layer.

FIG. 7 illustrates a perspective view of one row of antenna elements that includes a ground plane and a reconfigurable resonator layer. Reconfigurable resonator layer 1230 includes an array of tunable slots 1210. The array of tunable slots 1210 can be configured to point the antenna in a desired direction. Each of the tunable slots can be tuned/adjusted by varying a voltage across the liquid crystal.

Figure 8A:
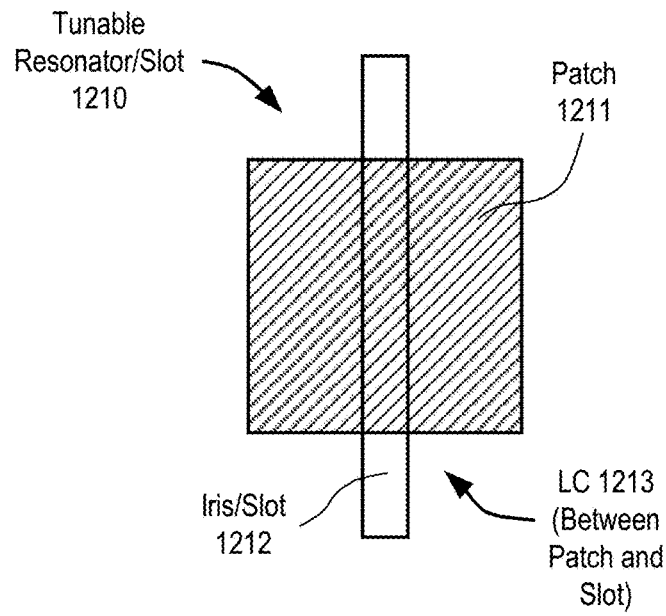
FIG. 8A illustrates one embodiment of a tunable resonator/slot.

Control module 1280 is coupled to reconfigurable resonator layer 1230 to modulate the array of tunable slots 1210 by varying the voltage across the liquid crystal in FIG. 8A. Control module 1280 may include a Field Programmable Gate Array ("FPGA"), a microprocessor, a controller, System-on-a-Chip (SoC), or other processing logic. In one embodiment, control module 1280 includes logic circuitry (e.g., multiplexer) to drive the array of tunable slots 1210. In one embodiment, control module 1280 receives data that includes specifications for a holographic diffraction pattern to be driven onto the array of tunable slots 1210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each Figure, a control module similar to control module 1280 may drive each array of tunable slots described in the Figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 1205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable slots 1210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram}=w_{in}*w_{out}$, with $w_{in}$ as the wave equation in the waveguide and $w_{out}$ the wave equation on the outgoing wave.

FIG. 8A illustrates one embodiment of a tunable resonator/slot 1210. Tunable slot 1210 includes an iris/slot 1212, a radiating patch 1211, and liquid crystal 1213 disposed between iris 1212 and patch 1211. In one embodiment, radiating patch 1211 is co-located with iris 1212.

Figure 8B:
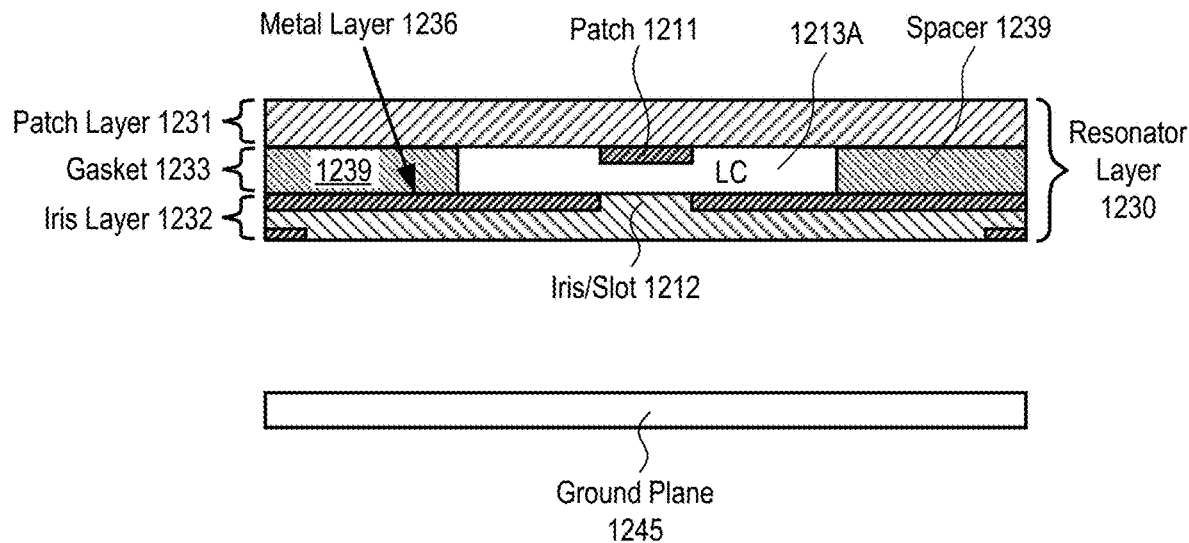
FIG. 8B illustrates a cross section view of one embodiment of a physical antenna aperture.

FIG. 8B illustrates a cross section view of one embodiment of a physical antenna aperture. The antenna aperture includes ground plane 1245, and a metal layer 1236 within iris layer 1232, which is included in reconfigurable resonator layer 1230. In one embodiment, the antenna aperture of FIG. 8B includes a plurality of tunable resonator/slots 1210 of FIG. 8A. Iris/slot 1212 is defined by openings in metal layer 1236. A feed wave, such as feed wave 1205 of FIG. 7, may have a microwave frequency compatible with satellite communication channels. The feed wave propagates between ground plane 1245 and resonator layer 1230.

Reconfigurable resonator layer 1230 also includes gasket layer 1233 and patch layer 1231. Gasket layer 1233 is disposed between patch layer 1231 and iris layer 1232. Note that in one embodiment, a spacer could replace gasket layer 1233. In one embodiment, iris layer 1232 is a printed circuit board ("PCB") that includes a copper layer as metal layer 1236. In one embodiment, iris layer 1232 is glass. Iris layer 1232 may be other types of substrates.

Openings may be etched in the copper layer to form slots 1212. In one embodiment, iris layer 1232 is conductively coupled by a conductive bonding layer to another structure (e.g., a waveguide) in FIG. 8B. Note that in an embodiment the iris layer is not conductively coupled by a conductive bonding layer and is instead interfaced with a non-conducting bonding layer.

Patch layer 1231 may also be a PCB that includes metal as radiating patches 1211. In one embodiment, gasket layer 1233 includes spacers 1239 that provide a mechanical standoff to define the dimension between metal layer 1236 and patch 1211. In one embodiment, the spacers are 75 microns, but other sizes may be used (e.g., 3-200 mm). As mentioned above, in one embodiment, the antenna aperture of FIG. 8B includes multiple tunable resonator/slots, such as tunable resonator/slot 1210 includes patch 1211, liquid crystal 1213, and iris 1212 of FIG. 8A. The chamber for liquid crystal 1213A is defined by spacers 1239, iris layer 1232 and metal layer 1236. When the chamber is filled with liquid crystal, patch layer 1231 can be laminated onto spacers 1239 to seal liquid crystal within resonator layer 1230.

A voltage between patch layer 1231 and iris layer 1232 can be modulated to tune the liquid crystal in the gap between the patch and the slots (e.g., tunable resonator/slot 1210). Adjusting the voltage across liquid crystal 1213 varies the capacitance of a slot (e.g., tunable resonator/slot 1210). Accordingly, the reactance of a slot (e.g., tunable resonator/slot 1210) can be varied by changing the capacitance. Resonant frequency of slot 1210 also changes according to the equation $f=1/2\pi\sqrt{LC}$ where f is the resonant frequency of slot 1210 and L and C are the inductance and capacitance of slot 1210, respectively. The resonant frequency of slot 1210 affects the energy radiated from feed wave 1205 propagating through the waveguide. As an example, if feed wave 1205 is 20 GHz, the resonant frequency of a slot 1210 may be adjusted (by varying the capacitance) to 17 GHz so that the slot 1210 couples substantially no energy from feed wave 1205. Or, the resonant frequency of a slot 1210 may be adjusted to 20 GHz so that the slot 1210 couples energy from feed wave 1205 and radiates that energy into free space. Although the examples given are binary (fully radiating or not radiating at all), full gray scale control of the reactance, and therefore the resonant frequency of slot 1210 is possible with voltage variance over a multi-valued range. Hence, the energy radiated from each slot 1210 can be finely controlled so that detailed holographic diffraction patterns can be formed by the array of tunable slots.

In one embodiment, tunable slots in a row are spaced from each other by $\lambda/5$. Other spacings may be used. In one embodiment, each tunable slot in a row is spaced from the closest tunable slot in an adjacent row by $\lambda/2$, and, thus, commonly oriented tunable slots in different rows are spaced by $\lambda/4$, though other spacings are possible (e.g., $\lambda/5$, $\lambda/6.3$). In another embodiment, each tunable slot in a row is spaced from the closest tunable slot in an adjacent row by $\lambda/3$.

Embodiments use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015.

FIGS. 9A-D illustrate one embodiment of the different layers for creating the slotted array. The antenna array includes antenna elements that are positioned in rings, such as the example rings shown in FIG. 6. Note that in this example the antenna array has two different types of antenna elements that are used for two different types of frequency bands.

Figure 9A:
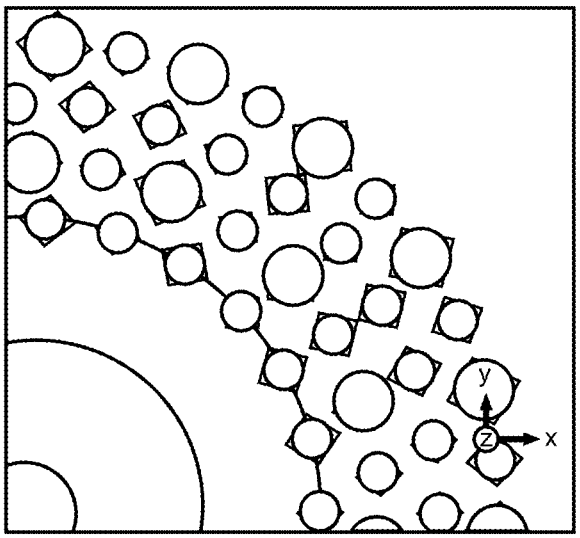
FIG. 9A illustrates a portion of the first iris board layer with locations corresponding to the slots.
Figure 9B:
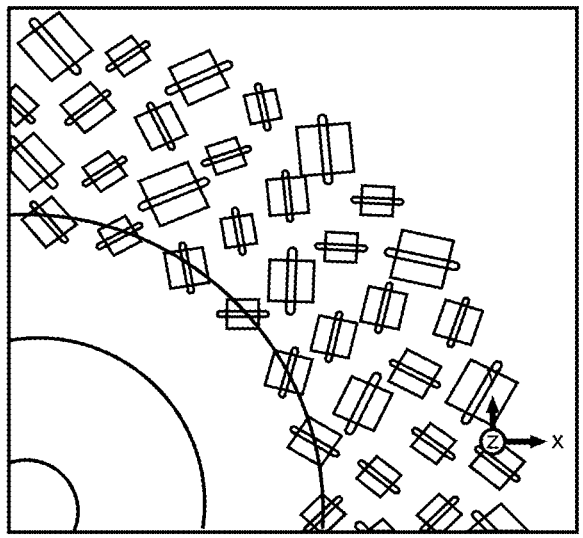
FIG. 9B illustrates a portion of the second iris board layer containing slots.
Figure 9C:
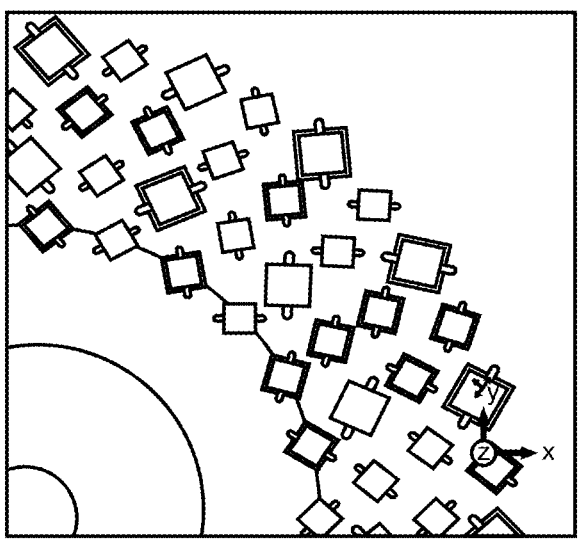
FIG. 9C illustrates patches over a portion of the second iris board layer.
Figure 9D:
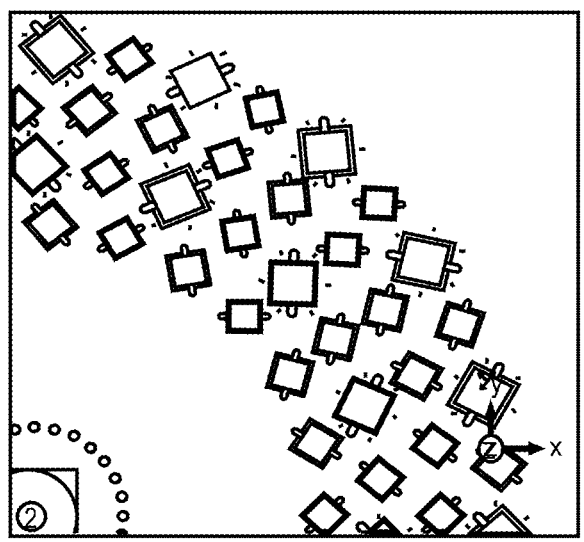
FIG. 9D illustrates a top view of a portion of the slotted array.

FIG. 9A illustrates a portion of the first iris board layer with locations corresponding to the slots. Referring to FIG. 9A, the circles are open areas/slots in the metallization in the bottom side of the iris substrate, and are for controlling the coupling of elements to the feed (the feed wave). Note that this layer is an optional layer and is not used in all designs. FIG. 9B illustrates a portion of the second iris board layer containing slots. FIG. 9C illustrates patches over a portion of the second iris board layer. FIG. 9D illustrates a top view of a portion of the slotted array.

Figure 10:
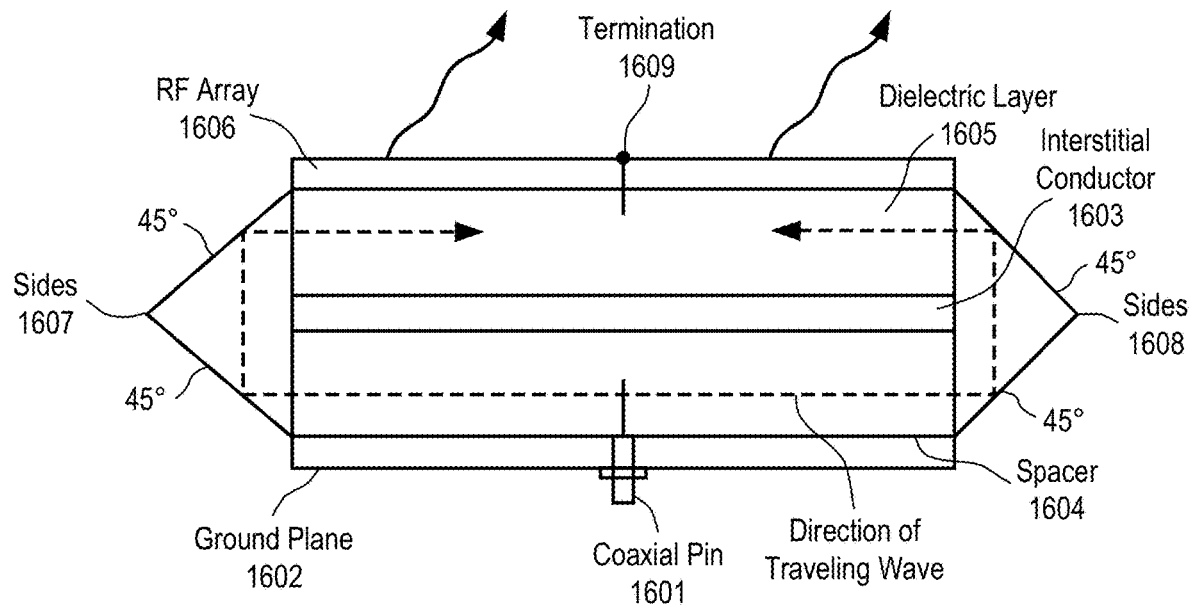
FIG. 10 illustrates a side view of one embodiment of a cylindrically fed antenna structure.

FIG. 10 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 10 includes a coaxial feed, such as, for example, described in U.S. Publication No. 2015/0236412, entitled "Dynamic Polarization and Coupling Control from a Steerable Cylindrically Fed Holographic Antenna", filed on Nov. 21, 2014.

Referring to FIG. 10, a coaxial pin 1601 is used to excite the field on the lower level of the antenna. In one embodiment, coaxial pin 1601 is a 50Ω coax pin that is readily available. Coaxial pin 1601 is coupled (e.g., bolted) to the bottom of the antenna structure, which is conducting ground plane 1602.

Separate from conducting ground plane 1602 is interstitial conductor 1603, which is an internal conductor. In one embodiment, conducting ground plane 1602 and interstitial conductor 1603 are parallel to each other. In one embodiment, the distance between ground plane 1602 and interstitial conductor 1603 is 0.1-0.15". In another embodiment, this distance may be $\lambda/2$, where $\lambda$ is the wavelength of the travelling wave at the frequency of operation.

Ground plane 1602 is separated from interstitial conductor 1603 via a spacer 1604. In one embodiment, spacer 1604 is a foam or air-like spacer. In one embodiment, spacer 1604 comprises a plastic spacer.

On top of interstitial conductor 1603 is dielectric layer 1605. In one embodiment, dielectric layer 1605 is plastic. The purpose of dielectric layer 1605 is to slow the travelling wave relative to free space velocity. In one embodiment, dielectric layer 1605 slows the travelling wave by 30% relative to free space. In one embodiment, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric 1605, such as periodic sub-wavelength metallic structures that can be machined or lithographically defined, for example.

An RF-array 1606 is on top of dielectric 1605. In one embodiment, the distance between interstitial conductor 1603 and RF-array 1606 is 0.1-0.15". In another embodiment, this distance may be $\lambda_{eff}/2$, where $\lambda_{eff}$ is the effective wavelength in the medium at the design frequency.

The antenna includes sides 1607 and 1608. Sides 1607 and 1608 are angled to cause a travelling wave feed from coax pin 1601 to be propagated from the area below interstitial conductor 1603 (the spacer layer) to the area above interstitial conductor 1603 (the dielectric layer) via reflection. In one embodiment, the angle of sides 1607 and 1608 are at 45° angles. In an alternative embodiment, sides 1607 and 1608 could be replaced with a continuous radius to achieve the reflection. While FIG. 10 shows angled sides that have angle of 45 degrees, other angles that accomplish signal transmission from lower-level feed to upper-level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers.

In operation, when a feed wave is fed in from coaxial pin 1601, the wave travels outward concentrically oriented from coaxial pin 1601 in the area between ground plane 1602 and interstitial conductor 1603. The concentrically outgoing waves are reflected by sides 1607 and 1608 and travel inwardly in the area between interstitial conductor 1603 and RF array 1606. The reflection from the edge of the circular perimeter causes the wave to remain in phase (i.e., it is an in-phase reflection). The travelling wave is slowed by dielectric layer 1605. At this point, the travelling wave starts interacting and exciting with elements in RF array 1606 to obtain the desired scattering.

To terminate the travelling wave, a termination 1609 is included in the antenna at the geometric center of the antenna. In one embodiment, termination 1609 comprises a pin termination (e.g., a 50Ω pin). In another embodiment, termination 1609 comprises an RF absorber that terminates unused energy to prevent reflections of that unused energy back through the feed structure of the antenna. These could be used at the top of RF array 1606.

Figure 11:
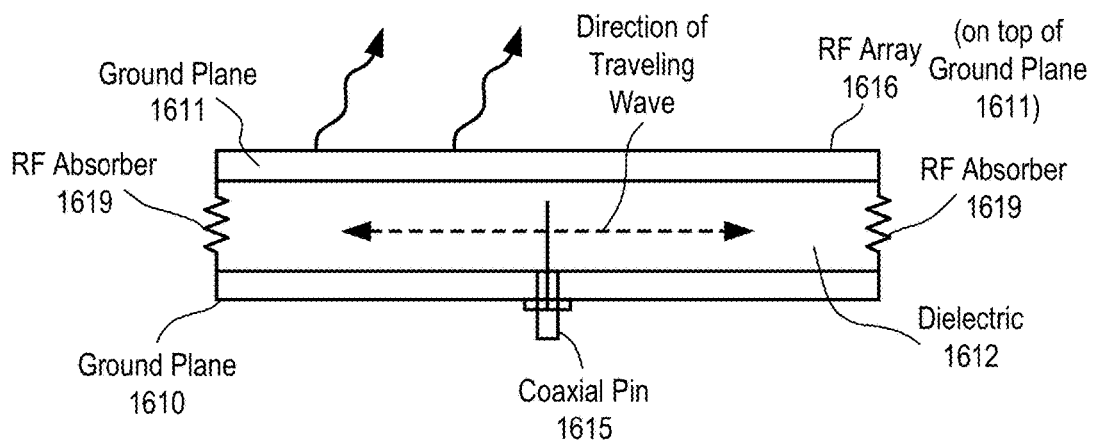
FIG. 11 illustrates another embodiment of the antenna system with an outgoing wave.

FIG. 11 illustrates another embodiment of the antenna system with an outgoing wave. Referring to FIG. 11, two ground planes 1610 and 1611 are substantially parallel to each other with a dielectric layer 1612 (e.g., a plastic layer, etc.) in between ground planes. RF absorbers 1619 (e.g., resistors) couple the two ground planes 1610 and 1611 together. A coaxial pin 1615 (e.g., 50Ω) feeds the antenna. An RF array 1616 is on top of dielectric layer 1612 and ground plane 1611.

In operation, a feed wave is fed through coaxial pin 1615 and travels concentrically outward and interacts with the elements of RF array 1616.

The cylindrical feed in both the antennas of FIGS. 10 and 11 improves the service angle of the antenna. Instead of a service angle of plus or minus forty-five degrees azimuth (±45° Az) and plus or minus twenty-five degrees elevation (±25° El), in one embodiment, the antenna system has a service angle of seventy-five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Embodiments of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 1606 of FIG. 10 and RF array 1616 of FIG. 11 include a wave scattering subsystem that includes a group of patch antennas (i.e., scatterers) that act as radiators. This group of patch antennas comprises an array of scattering metamaterial elements.

In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor.

In one embodiment, a liquid crystal (LC) is injected in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, the liquid crystal acts as an on/off switch for the transmission of energy from the guided wave to the CELC. When switched on, the CELC emits an electromagnetic wave like an electrically small dipole antenna.

Controlling the thickness of the LC increases the beam switching speed. A fifty percent (50%) reduction in the gap between the lower and the upper conductor (the thickness of the liquid crystal) results in a fourfold increase in speed. In another embodiment, the thickness of the liquid crystal results in a beam switching speed of approximately fourteen milliseconds (14 ms). In one embodiment, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one embodiment, the cylindrical feed geometry of this antenna system allows the CELC elements to be positioned at forty-five-degree (45°) angles to the vector of the wave in the wave feed. This position of the elements enables control of the polarization of the free space wave generated from or received by the elements. In one embodiment, the CELCs are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Cell Placement

Figure 12:
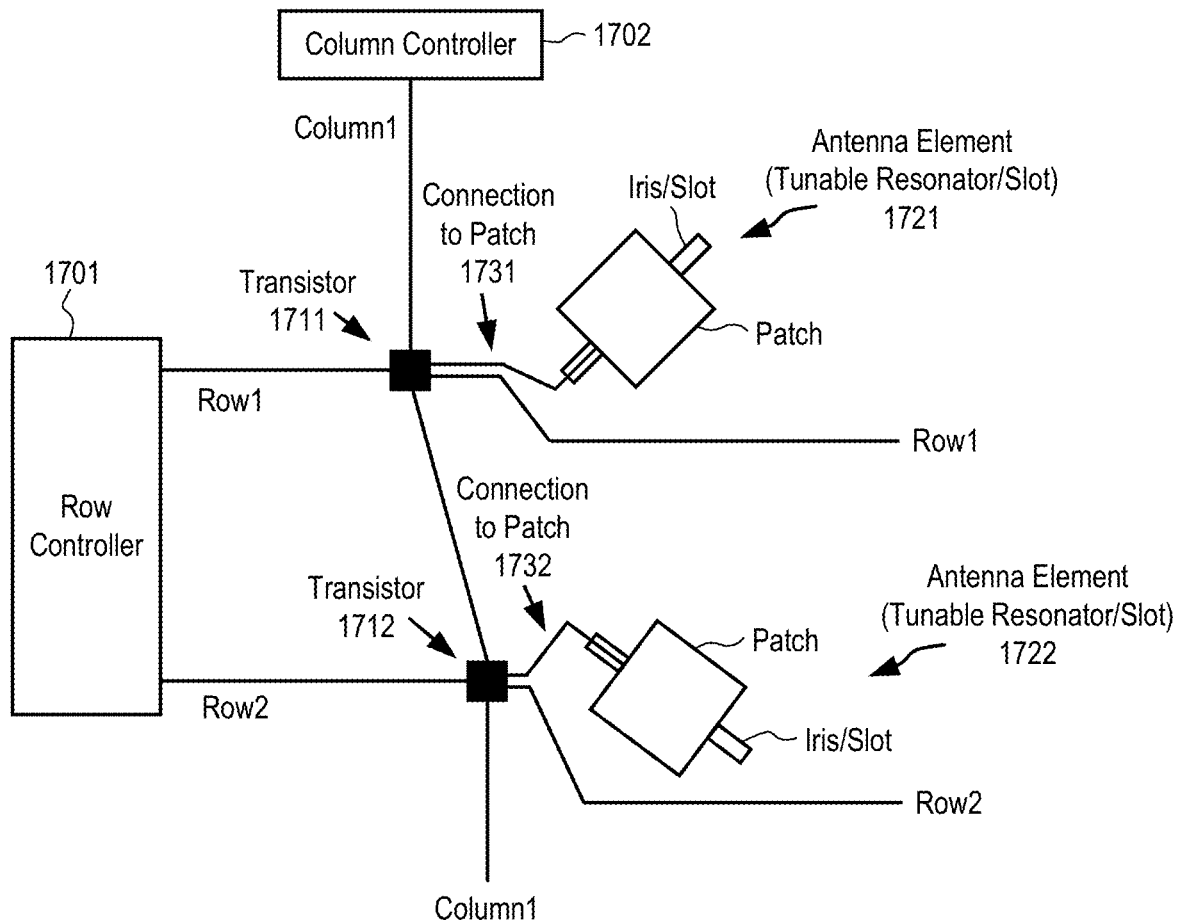
FIG. 12 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 12 illustrates one embodiment of the placement of matrix drive circuitry with respect to antenna elements. Referring to FIG. 12, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In one embodiment, the matrix drive circuitry is pre-defined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 13:
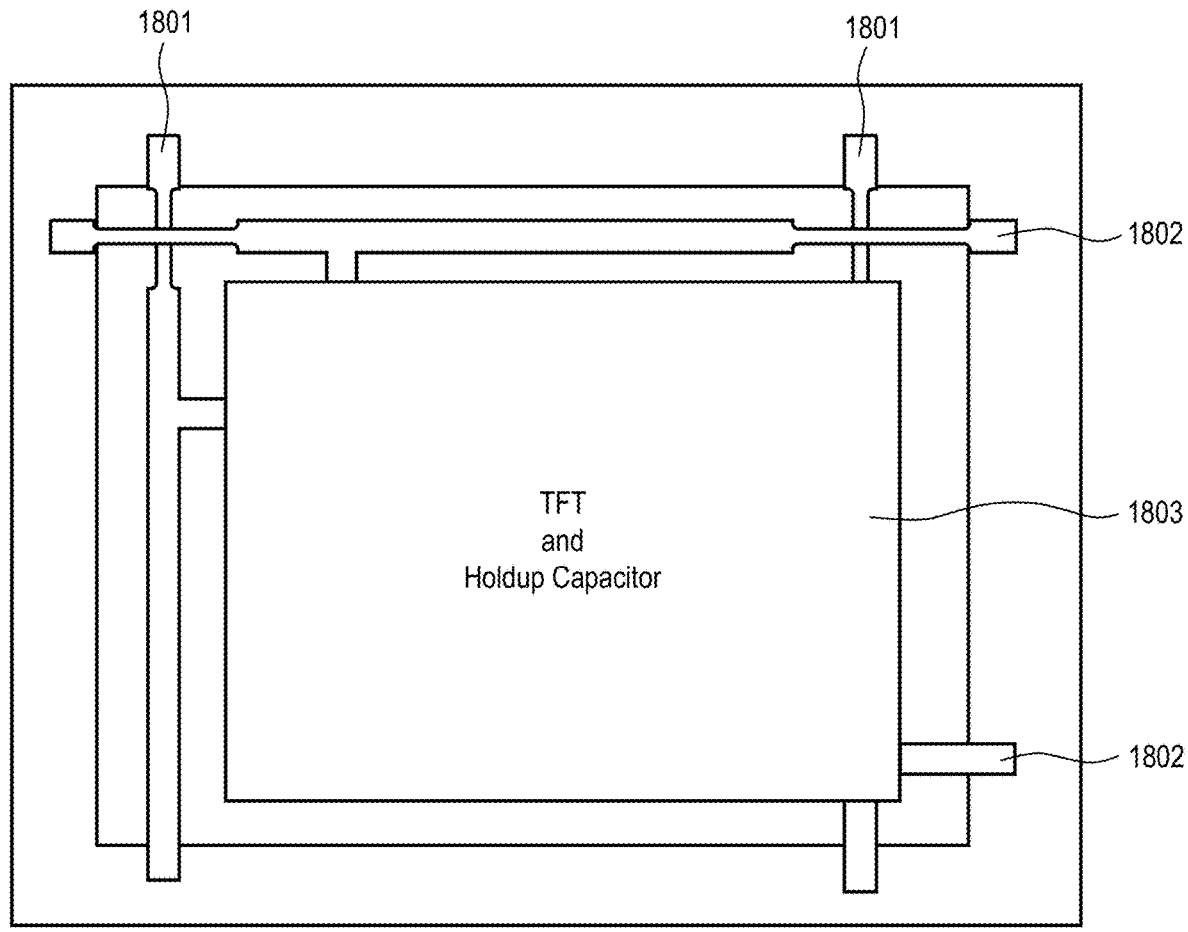
FIG. 13 illustrates one embodiment of a TFT package.

In one embodiment, a TFT package is used to enable placement and unique addressing in the matrix drive. FIG. 13 illustrates one embodiment of a TFT package. Referring to FIG. 13, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

An Example of a Full Duplex Communication System

Figure 14:
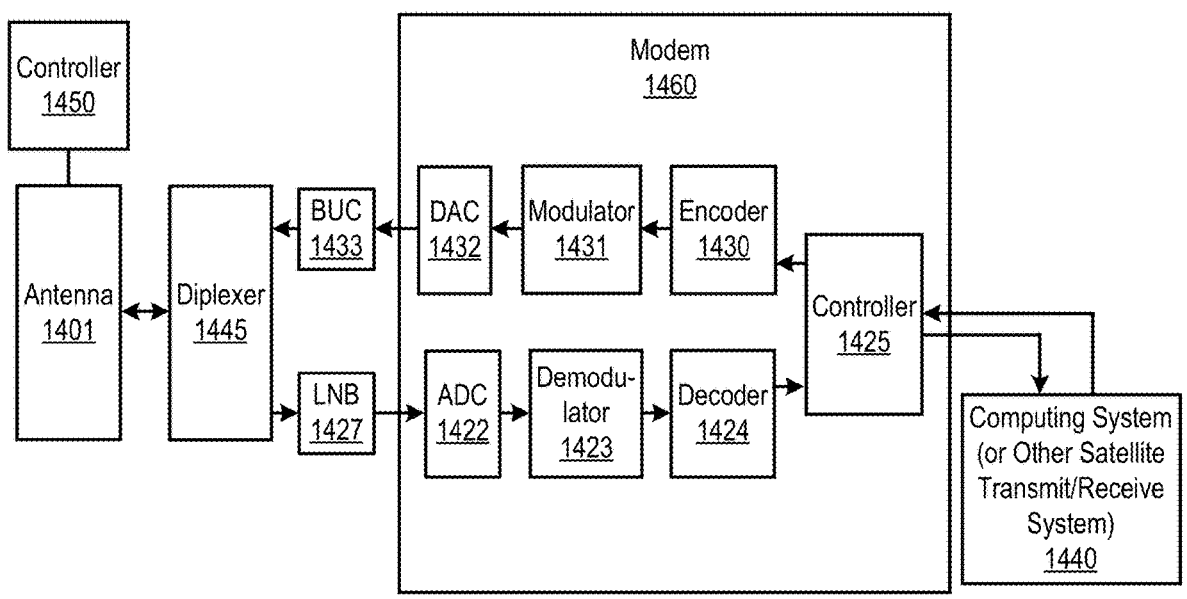
FIG. 14 is a block diagram of another embodiment of a communication system having simultaneous transmit and receive paths.

In another embodiment, the combined antenna apertures are used in a full duplex communication system. FIG. 14 is a block diagram of another embodiment of a communication system having simultaneous transmit and receive paths. While only one transmit path and one receive path are shown, the communication system may include more than one transmit path and/or more than one receive path.

Referring to FIG. 14, antenna 1401 includes two spatially interleaved antenna arrays operable independently to transmit and receive simultaneously at different frequencies as described above. In one embodiment, antenna 1401 is coupled to diplexer 1445. The coupling may be by one or more feeding networks. In one embodiment, in the case of a radial feed antenna, diplexer 1445 combines the two signals and the connection between antenna 1401 and diplexer 1445 is a single broad-band feeding network that can carry both frequencies.

Diplexer 1445 is coupled to a low noise block down converter (LNB) 1427, which performs a noise filtering function and a down conversion and amplification function in a manner well-known in the art. In one embodiment, LNB 1427 is in an out-door unit (ODU). In another embodiment, LNB 1427 is integrated into the antenna apparatus. LNB 1427 is coupled to a modem 1460, which is coupled to computing system 1440 (e.g., a computer system, modem, etc.).

Modem 1460 includes an analog-to-digital converter (ADC) 1422, which is coupled to LNB 1427, to convert the received signal output from diplexer 1445 into digital format. Once converted to digital format, the signal is demodulated by demodulator 1423 and decoded by decoder 1424 to obtain the encoded data on the received wave. The decoded data is then sent to controller 1425, which sends it to computing system 1440.

Modem 1460 also includes an encoder 1430 that encodes data to be transmitted from computing system 1440. The encoded data is modulated by modulator 1431 and then converted to analog by digital-to-analog converter (DAC) 1432. The analog signal is then filtered by a BUC (up-convert and high pass amplifier) 1433 and provided to one port of diplexer 1445. In one embodiment, BUC 1433 is in an out-door unit (ODU).

Diplexer 1445 operating in a manner well-known in the art provides the transmit signal to antenna 1401 for transmission.

Controller 1450 controls antenna 1401, including the two arrays of antenna elements on the single combined physical aperture.

The communication system would be modified to include the combiner/arbiter described above. In such a case, the combiner/arbiter after the modem but before the BUC and LNB.

Note that the full duplex communication system shown in FIG. 14 has a number of applications, including but not limited to, internet communication, vehicle communication (including software updating), etc.

There is a number of example embodiments described herein.

There is a number of example embodiments described herein.

Example 1 is an antenna comprising an array of antenna elements; and a structure coupled to the array of antenna elements, the structure having a plurality of components comprising materials having different coefficients of thermal expansion (CTEs), wherein first and second components of the plurality of components are pin bonded with one or more pins, and one or more components of the plurality of components other than the first and second components are between the first and second components and have one or more slots through which the one or more pins traverse and have CTEs different than CTEs of the first and second components.

Example 2 is the antenna of example 1 that may optionally include that the first and second components comprise materials with higher CTE than the one or more components.

Example 3 is the antenna of example 1 that may optionally include that the first and second components comprise materials with lower CTE than the one or more components.

Example 4 is the antenna of example 1 that may optionally include that each of the one or more pins comprise materials that do not detrimentally impact radio-frequency (RF) propagation of a feed wave.

Example 5 is the antenna of example 1 that may optionally include that each of the one or more pins comprises a dielectric pin.

Example 6 is the antenna of example 1 that may optionally include that each of the one or more pins comprises polystyrene material.

Example 7 is the antenna of example 1 that may optionally include that the one or more slots allow movement of the one or more components with respect to the first and second components in response to thermal expansion.

Example 8 is the antenna of example 1 that may optionally include that structure comprises an antenna feed.

Example 9 is the antenna of example 1 that may optionally include that the antenna feed includes bonded composite dielectric materials.

Example 10 is the antenna of example 9 that may optionally include that the dielectric materials comprise sintered dielectric materials.

Example 11 is the antenna of example 1 that may optionally include that the antenna feed includes corrugated dielectric materials.

Example 12 is the antenna of example 1 that may optionally include that the array of antenna elements are operable to radiate radio-frequency (RF) energy.

Example 13 is the antenna of example 1 that may optionally include that the array of antenna elements are RF radiating metamaterial antenna elements of a metasurface.

Example 14 is an antenna comprising: an antenna aperture having array of antenna elements; and a multi-component radio-frequency (RF) feed bonded to a bottom of the antenna aperture to propagate a feed wave to the antenna aperture, the RF feed comprising a plurality of components having different coefficients of thermal expansion (CTEs) and the CTE of the bottom of the antenna aperture is different than the CTE of a component of the RF feed to which the bottom of the antenna aperture is bonded, wherein bonding between the RF feed and the antenna aperture and between the plurality of components of the RF feed are only in a central area around an origin of the feed wave.

Example 15 is the antenna of example 14 that may optionally include that each of the bonds for the bonding between the RF feed and the antenna aperture and between the plurality of components of the RF feed is a non-slip bond.

Example 16 is the antenna of example 14 that may optionally include that each of the bonds for the bonding between the RF feed and the antenna aperture and between the plurality of components of the RF feed is a disc-shaped bond between ¼ inch to 8 inches in diameter centered at the origin of the feed wave.

Example 17 is the antenna of example 14 that may optionally include that one or more of the bonds are pressure sensitive adhesive (PSA).

Example 18 is the antenna of example 14 that may optionally include a support structure bonded to a bottom of the RF feed around the origin of the feed wave; and a centrally-located launch assembly coupled through the support structure for providing the feed wave to the RF feed at the origin, and wherein the aperture, RF feed and support structure are in parallel without being constrained in planar thermal movement outside of the central area.

Example 19 is the antenna of example 18 that may optionally include that the RF feed includes an RF termination around its outer edge between the antenna aperture and the support structure, and further wherein the antenna aperture and support structure extend past the RF termination of the RF feed and are bonded with one or more outer bonds in an area outside of the RF termination.

Example 20 is the antenna of example 19 that may optionally include that the one or more outer bonds are located beyond a position of maximum expansion of the RF feed and the RF termination.

Example 21 is the antenna of example 19 that may optionally include that the one or more outer bounds are flexible to compensate for thermal expansion and contraction differences of the support structure and the antenna aperture due to different CTEs.

Example 22 is the antenna of example 19 that may optionally include that the one or more bonds are elastomeric.

Example 23 is the antenna of example 18 that may optionally include that the RF feed includes an RF termination around its outer edge between the antenna aperture and the support structure, and the antenna aperture and support structure are bonded with an inner bond that is located between the RF termination and an outer edge of the RF feed between the antenna aperture and the support structure, the inner bond being surrounded by a dielectric.

Example 24 is the antenna of example 14 that may optionally include a radome coupled to compress the antenna aperture, the RF feed and the support structure together into an assembly stack.

Example 25 is the antenna of example 24 that may optionally include a compliant layer between the radome and the antenna aperture.

Example 26 is the antenna of example 24 that may optionally include that the radome is compressed via a clamping ring or snap connections.

Example 27 is the antenna of example 24 that may optionally include that the radome is coupled to the support structure via spring fasteners.

Example 28 is an antenna comprising: an array of antenna elements; and a segmented, multi-component feed structure coupled to the array of antenna elements, the segmented multi-component structure having a plurality of layers comprising materials having different coefficients of thermal expansion (CTEs) bonded at central locations in each segment.

Example 29 is an antenna comprising: an array of antenna elements; and a feed coupled to the array and having corrugated feed dielectrics.

Example 30 is the antenna of example 29 that may optionally include that the corrugated feed dielectrics are bonded composite dielectric materials that enable RF effective index of refraction to be tuned for desired design targets.

Example 30 is the antenna of example 29 that may optionally include that the corrugated feed dielectrics are sintered dielectric materials containing plastics, bonded materials using ceramics, and/or on-woven plastic materials.

Example 31 is an antenna comprising: an array of antenna elements; and a radome coupled to compress the antenna aperture, the RF feed and the support structure together into an assembly stack.

Example 32 is the antenna of example 31 that may optionally include a compliant layer between the radome and the antenna aperture.

Example 33 is the antenna of example 31 that may optionally include that the radome is compressed via a clamping ring or snap connections.

Example 34 is the antenna of example 31 that may optionally include that the radome is coupled to the support structure via spring fasteners.

Example 35 is an antenna having one or more of the features in each of examples 1 through 34.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An antenna comprising:
an array of antenna elements; and
a structure coupled to the array of antenna elements, the structure having a plurality of components comprising materials having different coefficients of thermal expansion (CTEs), wherein first and second components of the plurality of components are pin bonded with one or more pins, and one or more components of the plurality of components other than the first and second components are between the first and second components and have one or more slots through which the one or more pins traverse and have CTEs different than CTEs of the first and second components to allow movement of at least one component of the one or more components between the first and second components around the one or more pins due to thermal expansion.

2. The antenna of claim 1 wherein the first and second components comprise materials with higher CTE than the one or more components.

3. The antenna of claim 1 wherein the first and second components comprise materials with lower CTE than the one or more components.

4. The antenna of claim 1 wherein each of the one or more pins comprise materials that do not detrimentally impact radio-frequency (RF) propagation of a feed wave.

5. The antenna of claim 1 wherein each of the one or more pins comprises a dielectric pin.

6. The antenna of claim 1 wherein each of the one or more pins comprises polystyrene material.

7. The antenna of claim 1 wherein the one or more slots allow movement of the one or more components with respect to the first and second components in response to thermal expansion.

8. The antenna of claim 1 wherein structure comprises an antenna feed.

9. The antenna of claim 8 wherein the antenna feed includes bonded composite dielectric materials.

10. The antenna of claim 9 wherein the dielectric materials comprise sintered dielectric materials.

11. The antenna of claim 8 wherein the antenna feed includes corrugated dielectric materials.

12. The antenna of claim 1 wherein the array of antenna elements are operable to radiate radio-frequency (RF) energy.

13. The antenna of claim 1 wherein the array of antenna elements are RF radiating metamaterial antenna elements of a metasurface.

* * * * *